(12) United States Patent
Yoshioka

(10) Patent No.: US 6,728,155 B2
(45) Date of Patent: Apr. 27, 2004

(54) SERIAL ACCESS MEMORY AND DATA WRITE/READ METHOD

(75) Inventor: Shigemi Yoshioka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/307,399

(22) Filed: Dec. 2, 2002

(65) Prior Publication Data

US 2003/0086323 A1 May 8, 2003

Related U.S. Application Data

(63) Continuation of application No. 09/773,024, filed on Feb. 1, 2001, now abandoned.

(30) Foreign Application Priority Data

Jun. 26, 2000 (JP) ........................................ 2000-190572

(51) Int. Cl.[7] ................................................. G11C 7/00

(52) U.S. Cl. .................... 365/221; 365/189.12; 365/239

(58) Field of Search ............................ 365/221, 189.12, 365/230.09, 239

(56) References Cited

U.S. PATENT DOCUMENTS

| | | | |
|---|---|---|---|
| 5,617,368 A | * | 4/1997 | Ishida ......................... 365/221 |
| 5,812,148 A | | 9/1998 | Takasugi et al. |
| 5,978,303 A | | 11/1999 | Takasugi et al. |
| 6,034,910 A | * | 3/2000 | Iwase ......................... 365/221 |
| 6,069,639 A | | 5/2000 | Takasugi |

* cited by examiner

Primary Examiner—Huan Hoang
(74) Attorney, Agent, or Firm—Volentine Francos, PLLC

(57) ABSTRACT

An object is to provide a serial access memory and a data write/read method applicable thereto and capable of reducing the test time of the serial access memory. After transferring the data stored in the memory cells MC11 to MCm1 connected with a word line WL1 to the read registers Rreg-1 to Rreg-m all at once, the data stored in the memory cells MC12 to MCm2 connected with a word line WL2 is transferred to the write registers Wreg-1 to Wreg-m all at once. The data stored in the read register is transmitted to an output means 123 through read data buses RD, /RD. The data stored in the write register is transmitted to the output means 123 through write data buses WD, /WD, an input/output means 122, and the second read data buses RD2, /RD2. The output means 123 compares the data transmitted from the read data buses RD, /RD with the data transmitted from second data buses RD2, /RD2.

9 Claims, 13 Drawing Sheets

SERIAL ACCESS MEMORY AND DATA WRITE/READ METHOD

CROSS-REFERENCE TO RELATED APPLICATIONS

This is a continuation of application Ser. No. 09/773,024, filed Feb. 1, 2001, now abandoned, which is incorporated herein by reference in its entirety.

BACKGROUND OF THE INVENTION

1. Field of the Invention

The present invention relates to a serial access memory and a data write/read method applicable thereto.

2. Prior Art

Generally, in a serial access memory of the line access type, when a line address (X-address) is externally applied thereto, the access (i.e. write/read operation) is executed to a word line as specified with that line address. An exemplary arrangement of a prior art serial access memory 1 of the line access type is illustrated in FIG. 11 of the accompanying drawings as a part of this specification.

The prior art serial access memory 1 is provided with a memory cell array 11, a memory control portion 12, an X-address means 13, a Y-address means on the write side (referred to "write Y-address means" hereinafter) 14, a Y-address means on the read side (referred to "read Y-address means) 15, the first transfer means group on the write side (referred to as "write side first transfer means group" hereinafter) 16, a register group on the write side (referred to as "write register group" hereinafter) 17, the second transfer means group on the write side (referred to as "write side second transfer means group" hereinafter) 18, the first transfer means group on the read side (referred to "read side second transfer means group) 19, a register group on the read side (referred to as "read register group") 20, the second transfer means group on the read side (referred to as "read side second transfer means group" hereinafter) 21, an input means 22, and an output means 23.

The X-address means 13 is controlled to select one word line from a plurality of word lines WL1 to WLn (n: positive integer) and to put the selected word line in a logical high-level state (referred to as "H-level" hereinafter) by the memory control portion 12.

The memory cell array 11 is made up of a plurality of memory cells MC11 to MCmn (m: positive integer), each of which is arranged at each of intersections made by the plural word lines WL1 to WLn and the plural bit line pairs BL1, /BL1 to BLm, /BLm. Each of the memory cells MC11 to MCmn includes one each of a transistor (not shown) and a capacitor (not shown).

The bit line pairs BL1, /BL1 to BLm, /BLm are respectively connected with corresponding sense amplifiers SA1 to SAm, with which the potential variation appearing on the bit line pairs BL1, /BL1 to BLm, /BLm is amplified.

In the next, there will be describe the structure of an electronic circuit arranged on the write side of the memory cell array 11.

The bit line pairs BL1, /BL1 to BLm, /BLm are connected with the write register group 17 through the write side first transfer means group 16. The write side first transfer means group 16 is made up of a plurality of write side first transfer means 16–1 to 16-*m* of which each corresponds to each of the bit line pairs BL1, /BL1 to BLm, /BLm. The write register group 17 is made up of a plurality of write registers Wreg-1 to Wreg-m of which each corresponds to each of the bit line pairs BL1, /BL1 to BLm, /BLm.

Each of the write side first transfer means 16–1 to 16-*m* is made up of two transistors. For instance, the bit line BL1 is connected with the write register Wreg-1 through the drain and source of one transistor forming the write side first transfer means 16-1 while the bit line /BL1 is connected with the write register Wreg-1 through the drain and source of the another transistor forming the write side first transfer means 16-1. The ON/OFF control of these 2×m transistors forming the write side first transfer means 16-1 to 16-*m* is carried out with a control signal WT.

The write register group 17 is connected with write data buses WD, /WD through the write side second transfer means group 18. This write side second transfer means group 18 is made up of a plurality of write side second transfer means 18-1 to 18-*m*, which correspond to the write registers Wreg-1 to Wreg-m making up the write register group 17, respectively.

Each of the write side second transfer means 18-1 to 18-*m* is made up of two transistors. For instance, the write register Wreg-1 is connected with write data buses WD, /WD through respective drains and sources of two transistors forming the write side second transfer means 18-1. Each of the write side second transfer means 18-1 to 18-*m* is made up so as to receive the write Y-address signals YW1 to YWm outputted from the write Y-address means 14, and the ON/OFF control of two transistors forming each of the write side second transfer means 18-1 to 18-*m* is carried out with the write Y-address signals YW1 to YWm.

The write data buses WD, /WD are connected with an input terminal DIN through the input means 22.

In the next, there will be described the structure of an electronic circuit arranged on the read side of the memory cell array 11.

The bit line pairs BL1, /BL1 to BLm, /BLm are connected with the read register group 20 through the read side first transfer means group 19. The read side first transfer means group 19 is made up of a plurality of read side first transfer means 19-1 to 19-*m*, of which each corresponds to each of the bit line pairs BL1, /BL1 to BLm, /BLm. The read register group 20 is made up of a plurality of read registers Rreg-1 to Rreg-m, of which each corresponds to each of the bit line pairs BL1, /BL1 to BLm, /BLm.

Each of the read side first transfer means 19-1 to 19-*m* is composed of two transistors. For instance, the bit line BL1 is connected with the read register Rreg-1 through the drain and source of one transistor forming the read side first transfer means 19-1 while the bit line /BL1 is connected with the read register Rreg-1 through the drain and source of the another transistor forming the read side first transfer means 19-1. The ON/OFF control of these 2×m transistors forming the read side first transfer means 19-1 to 19-*m* is carried out with a control signal RT.

The read register group 20 is connected with read data buses RD, /RD through the read side second transfer means group 21. This read side second transfer means group 21 is composed of a plurality of read side second transfer means 21-1 to 21-*m* respectively corresponding to the read registers Rreg-1 to Rreg-m which make up the read register group 20.

Each of the read side second transfer means 21-1 to 21-*m* is made up of two transistors. For instance, the read register Rreg-1 is connected with read data buses RD, /RD through the respective drains and sources of two transistors forming the read side second transfer means 21-1. Each of the read side second transfer means 21-1 to 21-*m* is formed so as to receive the read Y-address signals YR1 to YRm outputted from the read Y-address means 15, and the ON/OFF control of two transistors forming each of the read side second transfer means 21-1 to 21-m is carried out with the read Y-address signals YR1 to YRm.

The read data buses RD, /RD are connected with an output terminal DOUT through an output means 23.

The write/read operation of the prior art serial access memory 1 as arranged above will now be described with reference to FIGS. 12 and 13.

FIG. 12 is a timing chart for describing the write operation of the serial access memory 1. The write operation will be described with the passage of time as shown in the figure.

<Time t1> The write operation is commenced when a write X-address WXAD is serially inputted to the memory control portion 12. At this stage, however, in order to make it possible for the memory control portion 12 to take in the write X-address WXAD, a write address enable signal WADE of the H-level is inputted in advance to the memory control portion 12. To begin with, at time t1, the most significant bit (MSB) data Am of the write X-address WXAD is taken in the memory control portion 12. After that, each bit data of the write X-address WXAD is taken in sequence in the memory control portion 12 in synchronism with a clock signal CLK.

<Time t2> The least significant bit (LSB) data A1 of the write X-address WXAD is taken in the memory control portion 12, thereby the take-in operation of the write X-address WXAD being completed. At this stage, the write address enable signal WADE to be inputted to the memory control portion 12 is put in the logical low level state (referred to as the L-level herein after). In the following, the description will be made with respect to a case where the word line WL1 is selected with the write X-address WXAD.

<Time t3> The word line WL1 selected at time t2 is put in the H-level by the X-address means 13, and the control signal WT is also put in the H-level by the memory control portion 12. As the result of this, each data stored in the memory cells MC11 to MCm1 connected with the word line WL1 is transferred all at once to the write registers Wreg-1 to Wreg-m through the write side first transfer means group 16. Some bits of the data having been transferred to the write registers Wreg-1 to Wreg-m are masked depending on the contents of the input data DI1 to DIm to be written to the memory cells MC11 to MCm1 (write mask operation). With this, it is attempted to improve the efficiency in the write operation of the input data DI1 to DIm to the memory cells MC11 to MCm1.

<Time t4> The memory control portion 12 detects the write enable signal WE of the H-level in the rise timing of the clock signal CLK. With this, the substantial write operation is commenced. The write Y-address means 14 selects the write Y-address signal YW1 from the write Y-address signals YW1 to YWm and puts it in the H-level. At this time, the input data DI1 inputted from the input terminal DIN has been transmitted to the write data buses WD, /WD through the input means 22. Since the write side second transfer means 18-1 is put in the ON state with the write Y-address signal YW1, the input data DI1 is stored in the write register Wreg-1.

<Time t4 to t5> Up to time t5 from time t4, the write Y-address means 14 selects the write Y-address signals YW2 to YWm in sequence from the write Y-address signals YW1 to YWm in synchronism with the clock signal CLK and puts each of them in the H-level. On one hand, the input data DI2 to DIm are inputted to the input terminal DIN in sequence, and each of the input data DI2 to DIm is stored in the write registers Wreg-2 to Wreg-m.

<Time t6> With the input of a write reset signal WR to the memory control portion 12, there is commenced the transfer of the input data DI1 to DIm stored in the write register group 17 to the memory cell array 11.

<Time t7> The word line WL1 selected in the period of time t1 through t2 is put in the H-level by the X-address means 13 and further, the control signal WT is put in the H-level by the memory control means 12. As the result of this, the input data DI1 to DIm stored in the write register group 17 are transferred all at once to the memory cells MC11 to MCm1 connected with the word line WL1.

As discussed above, according to the prior art serial access memory 1 of the line access type, it is made possible to execute the write operation on the basis of X-address by X-address (although described about only the word line WL1 here).

FIG. 13 is a timing chart for describing the read operation in connection with the serial access memory 1. The read operation will now be described with the passage of time as shown in the figure.

<Time t1> The read operation is commenced when serially inputting a read X-address RXAD to the memory control portion 12. At this stage, in order to make it possible for the memory control portion 12 to take in the read X-address RXAD, a read address enable signal RADE of the H-level is inputted in advance to the memory control portion 12. To begin with, at time t1, the most significant bit (MSB) data Am of the read X-address RXAD is taken in the memory control portion 12. After that, each bit data of the read X-address RXAD is taken in sequence in the memory control portion 12 in synchronism with a clock signal CLK.

<Time t2> The least significant bit (LSB) data A1 of the read X-address RXAD is taken in the memory control portion 12, thereby the take-in operation of the read X-address RXAD being completed. At this stage, the read address enable signal RADE to be inputted to the memory control portion 12 is put in the L-level. In the following, the description will be made in connection with a case where a word line WL1 has been selected with the read X-address RXAD.

<Time t3> The word line WL1 selected at time t2 is put in the H-level by the X-address means 13, and the control signal RT is also put in the H-level by the memory control portion 12. As the result of this, each data stored in the memory cells MC11 to MCm1 connected with the word line WL1 is transferred all at once to the read registers Rreg-1 to Rreg-m through the read side first transfer means group 19.

<Time t4> The memory control portion 12 detects the read enable signal RE of the H-level in the rise timing of the clock signal CLK. With this, the substantial read operation is commenced. The read Y-address means 15 selects the read Y-address signal YR1 from the read Y-address signals YR1 to YRm and puts it in the H-level. Since the read side second transfer means 21-1 is put in the ON state with the read Y-address signal YR1 of the H-level, the data stored in the read register Rreg-1 is transmitted to the read data buses RD, /RD. The data transmitted to the read data buses RD, /RD is outputted as an output data DO1 from the output terminal DOUT through the output means 23.

<Time t4 to t5> Up to time t5 from time t4, the read Y-address means 15 selects in sequence the read Y-address signals YR2 to YRm from the read Y-address signals YR1 to YRm in synchronism with the clock signal CLK and puts each of them in the H-level. As this goes on, each data stored in the read registers Rreg-2 to Rreg-m is transmitted in sequence to read data buses RD, /RD. Each of data transmitted in sequence to the data buses RD, /RD is outputted as the output data DO2 to DOm from the output terminal DOUT through the output means 23.

As described above, according to the prior art serial access memory 1 of the line access type, it is made possible to execute the read operation on the basis of X-address by X-address (although described about only the word line WL1 here).

By the way, in the write operation of the serial access memory 1 at time t3 shown in FIG. 12, in order to transfer each data stored in the memory cells MC11 to MCm1 to the write registers Wreg-1 to Wreg-m by putting the logical level of the word line WL1 in the H-level, it takes a time of 200 to 300 ns as a write data transfer time. Furthermore, in the read operation of the serial access memory 1 at time t3 shown in FIG. 13, in order to transfer each data stored in the memory cells MC11 to MCm1 to the read registers Rreg-1 to Rreg-m by putting the logical level of the word line WL1 in the H-level, it also takes a time of 200 to 300 ns as a read data transfer time.

In case of the prior art serial access memory 1 of the line access type, since the read operation and the write operation are executed in a synchronism with each other, it is necessary to take account of a case where the write data transfer operation from time t3 in the write operation might overlap with the read data transfer operation from time t3 in the read operation. In addition to this, there might be a case where the self-refresh operation overlap with the above two operations. Therefore, as shown in FIGS. 12 and 13, in the write and read operations of the serial access memory 1, three kinds of time, that is, a write data transfer time, a read data transfer time, and a wait time (period of time t3 through t4, which is about 1.5 $\mu$s) which is made by adding a certain margin to the self-refresh time, are set as a functional specification.

As discussed above, in order to commence the substantial data write/read operation of the prior art serial access memory 1, it is needed to wait for the passage of the wait time after one X-address has been applied to the memory control portion 12 and taken in thereby.

In the process of developing or manufacturing the serial access memory 1, there is carried out in general a test in which a predetermined data is first written in each memory cell and then read out therefrom, thereby verifying whether or not each data has been rightly stored in each memory cell without any failure. In case of the serial access memory 1 of the line access type, the above wait time takes place every access to the X-address. Consequently, in the test of the serial access memory 1 in which the write/read operation is carried out with respect to all the X-addresses, this wait time has been a very factor against the reduction of the test time.

The invention has been made in view of the problems as described above and a main object thereof is to provide an improved serial access memory capable of reducing the test time thereof and a data write/read method applicable thereto.

SUMMARY OF THE INVENTION

According to the first aspect of the invention, in order to solve such problems as described above, there is provided a data write/read method applicable to a serial access memory of the class in which there are provided a plurality of memory cells arranged at each of intersections made by a plurality of word lines and a plurality of bit lines, the first register having a capacity capable of storing one word data stored in the plural memory cells connected with each word line, and the second register having a capacity capable of storing one word data stored in the plural memory cells connected with each word line. This method is characterized by including the first write step of storing the first input serial data of one word in the first register, and the second write step of transferring the one word data stored in the first register in the first write step, to the plural memory cells connected with each of a plurality of first selected word lines selected from the plural word lines. According to this method, if the first input serial data is stored in the first register only once, the data come to be written in the memory cells connected with plural word lines. Thus, it is made possible to reduce the time required for the data write.

According to the second aspect of the invention, there is provided another data write/read method applicable to the serial access memory. This method further includes the following two steps in addition to the steps of the method according to the first aspect of the invention, that is, the third write step of storing the second input serial data of one word in the first register, the second input serial data of one word being obtained by inverting the logical level of each bit of the first input serial data, and the fourth write step of transferring the one word data stored in the first register in the third write step, to a plurality of memory cells connected with each of a plurality of the second selected word lines selected from the plural word lines. Furthermore, according to the third aspect of the invention, there is provided still another data write/read method applicable to the serial access memory. This method further includes the following steps in addition to the steps of the method according to the first aspect of the invention, that is, the third write step of transferring the data stored in the first register in the first write step, through a logic level inversion and transfer means serving to invert the logical level of the data on the basis of bit by bit, to a plurality of memory cells connected with each of a plurality of the second selected word lines selected from the plural word lines. According to these methods, the one word data stored in the plural memory cells connected with the first selected word line and the one word data stored in the plural memory cells connected with the second selected word line, have such a relation there between that the logical level of each bit of the latter one word data is obtained by inverting the logical level of each corresponding bit of the former one word data.

According to the fourth aspect of the invention, there is provided still another data write/read method applicable to the serial access memory. This method further includes the following two steps in addition to the steps of the method according to the first aspect of the invention, that is, the first read step of selecting two word lines from the plural first selected word lines, transferring the storage data of a plurality of memory cells connected with one of the selected two word lines to the second register, and transferring the storage data of a plurality of memory cells connected with the other word line of the selected two word line to the first register, and the second read step of serially reading out the data transferred to the first register in the first read step and serially reading out the data transferred to the second register. The data write/read method applicable to the serial access memory according to the invention is characterized by including the first read step of selecting one first selected word line from the plural first selected word lines and transferring the data stored in a plurality of memory cells connected with the one first selected word line to the second register, the second read step of selecting one second selected word line from the plural second selected word lines and transferring the storage data of a plurality of memory cells connected with the one second selected word line to the first register, and the third read step of serially reading out the data transferred to the second register according to the first read step and serially reading out the data transferred to the first register according to the second read step. Since the first register and the second register are used when reading the data, it becomes possible to read out the storage data from the memory cells connected with each of two word lines at the same time. The time needed for reading the data can be reduced, accordingly.

Furthermore, the data write/read method applicable to the serial access memory according to the invention includes a step of comparing the data serially read out from the first register with the data serially read out from the second register on the bit by bit basis. According to this method, it is made easier to judge whether or not the data is correctly stored in each memory cell and whether or not the data is rightly read out from each memory cell as well.

Still further, the data write/read method applicable to the serial access memory according to the invention is characterized by including the logical level inversion step of inverting the logical level of each bit of the data which is serially read out from the first register prior to the data comparison step. In case the serial data read out from the first register and the serial data read out from the second register have such a relation there between that the logical level of each bit of the data from the second register is obtained by inverting the logical level of each corresponding bit of the data from the first register, the comparison of the above two data from the first and second registers is made easier if inverting the logical level of each bit of the data from the first register before executing the step of comparison.

According to the fifth aspect of the invention, there is provided a serial access memory wherein there are provided a plurality of memory cells which are arranged at each of intersections made by a plurality of word lines and a plurality of bit lines, a register having a capacity capable of storing one word data stored in the plural memory cells connected with each word line and storing input serial data of one word, and a register data transfer means transferring the one word data stored in the register as it is or after inverting the logical level of each bit thereof, to a plurality of memory cells connected with one selected word line selected from the plural word lines. According to the constitution of the serial access memory as described above, it becomes possible to write the data in the memory cells connected with a plurality of word lines when writing and storing an input serial data in the first register only once. Moreover, it becomes possible to selectively store either the data stored in the register or the logical level inverted data stored in the register on the word line by word line basis.

According to the sixth aspect of the invention, there is provided a serial access memory wherein there are provided a plurality of memory cells which are arranged at each of intersections made by a plurality of word lines and a plurality of bit lines, a register having m pieces of a data storage region (referred to as "m data storage regions" hereinafter) and transferring the data stored in m data storage regions, to each of m pieces of memory cell (referred to as "m memory cells" hereinafter) connected with one selected word line selected from the plural word lines, m pieces of a bus data transfer means (referred to as "m bus data transfer means" hereinafter) being assigned to each of m data storage regions and transferring the data transmitted to the data bus to each data storage region, and a bus data transfer instruction means selecting in sequence m bus data transfer means one each or a plurality of them each and instructing the selected bus data transfer means to transfer the data transmitted in sequence to the data buses, to m data storage regions in sequence. With the constitution of the serial access memory as described above, it becomes possible to store the same data in plural storage regions at the same time. Therefore, it become possible to reduce the time needed for storing the data in all the storage regions of the register. It becomes also possible to shorten the length of the data to be transmitted to the data bus as compared with the length of the register.

According to the seventh aspect of the invention, there is provided a serial access memory wherein there are provided a plurality of memory cells which are arranged at each of intersections made by a plurality of word lines and a plurality of bit lines, a register having the m data storage regions and transferring the data stored in the m data storage regions to each of the m memory cells connected with one selected word line selected from the plural word lines, an address means for asserting the m address signals in sequence and outputting the asserted address signals, and the m data transfer means being assigned to each of the m data storage regions and having the function of transferring the m address signals to each of the data storage regions as the data, and also having the function of transferring the input serial data transmitted to the data bus, to each of the m data storage regions with the m address signals. Since the m address signals stored in the data storage regions as the data are asserted in sequence by the address means by one each, the logical level of the data stored in one of the data storage regions comes to be different from that of the data stored in all the other data storage regions in a certain timing, and the address of the data storage region storing the data having the logical level which is different from that of the other data, is shifted every change of the address signal to be asserted. Therefore, the position of the memory cell storing the data having the different logical level is shifted by incrementing the address of the word line selected from the plural word lines by one, every time of asserting the address signal in sequence.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings.

DETAILED DESCRIPTION OF THE PREFERRED EMBODIMENTS

Figure 1:
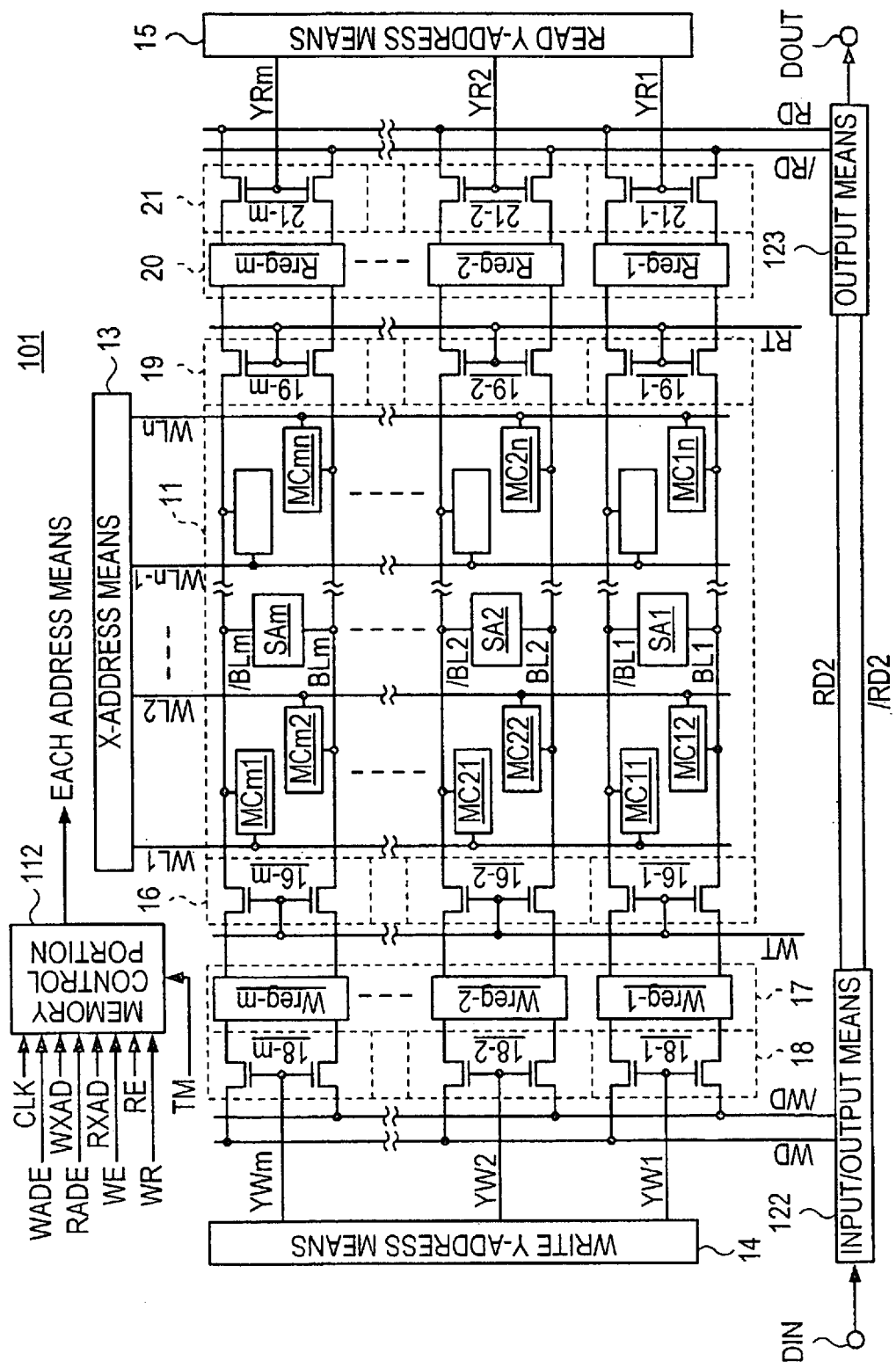
FIG. 1 is a circuit diagram for showing the constitution of a serial access memory according to the first embodiment of the invention.

A serial access memory and a data write/read method according to the invention will now be described in detail by way of several exemplary preferred embodiments of the invention with reference to the accompanying drawings as listed as follows. In the following description and accompanying drawings, like parts constituting the invention are denoted with like reference numerals and symbols in order to avoid the repetitive redundant description.

[First Embodiment]

FIG. 1 is a diagrammatic view showing the constitution of a serial access memory 101 according to the first embodiment of the invention.

The serial access memory 101 is provided with a memory cell array 11, a memory control portion 112, an X-address means 13, a write Y-address means 14, a read Y-address means 15, a write side first transfer means group 16, a write register group 17, a write side second transfer means group 18, a read side first transfer means group 19, a read register group 20, a read side second transfer means group 21, an input/output means 122, and an output means 123. In other words, the serial access memory 101 has such a structure that the memory control portion 12, the input means 22 and the output means 23 of the prior art serial access memory 1 are replaced by the memory control portion 112, the input/output means 122 and the output means 123, respectively.

The X-address means 13 is controlled to select one word line from a plurality of word lines WL1 to WLn (n: positive integer) and to put the selected word line in the H-level by the memory control portion 112.

The memory cell array 11 is made up of a plurality of memory cells MC11 to MCmn (m: positive integer), each of which is arranged at each of intersections made by a plurality of word lines WL1 to WLn and a plurality of bit line pairs BL1, /BL1 to BLm, /BLm. Each of the memory cells MC11 to MCmn is made up of one each of a transistor (not shown) and a capacitor (not shown).

The bit line pairs BL1, /BL1 to BLm, /BLm are connected with a plurality of sense amplifiers SA1 to SAm, by which a potential variation appearing on the bit line pairs BL1, /BL1 to BLm, /BLm is amplified.

Now, there will be described the structure and function of an electronic circuit arranged on the write side of the memory cell array 11.

The bit line pairs BL1, /BL1 to BLm, /BLm are connected with the write register group 17 through the write side first transfer means group 16. The write side first transfer means group 16 is made up of a plurality of write side first transfer means 16-1 to 16-*m* which correspond to the bit line pairs BL1, /BL1 to BLm, /BLm, respectively. The write register group 17 is composed of a plurality of write registers Wreg-1 to Wreg-m which correspond to the bit line pairs BL1, /BL1 to BLm, /BLm, respectively.

Each of the write side first transfer means 16-1 to 16-*m* is made up of two transistors. For instance, the bit line BL1 is connected with the write register Wreg-1 through the drain and source of one transistor forming the write side first transfer means 16-1 while the bit line /BL1 is connected with the write register Wreg-1 through the drain and source of the other transistor forming the write side first transfer means 16-1. The ON/OFF control of these 2×m transistors forming the write side first transfer means 16-1 to 16-*m* is carried out with a control signal WT.

The write register group 17 is connected with write data buses WD, /WD through the write side second transfer means group 18. This write side second transfer means group 18 is made up of a plurality of write side second transfer means 18-1 to 18-*m* corresponding to the write registers Wreg-1 to Wreg-m, respectively, which make up the write register group 17.

Each of the write side second transfer means 18-1 to 18-*m* is made up of two transistors. For instance, the write register Wreg-1 is connected with write data buses WD, /WD through respective drains and sources of two transistors making up the write side second transfer means 18-1. Each of the write side second transfer means 18-1 to 18-*m* is arranged so as to receive the write Y-address signals YW1 to YWm outputted from the write Y-address means 14, and the ON/OFF control of two transistors making up each of the write side second transfer means 18-1 to 18-*m* is carried out with the write Y-address signals YW1 to YWm.

The write data buses WD, /WD are connected with an input terminal DIN through an input/output means 122.

In the next, there will be described the structure of an electronic circuit arranged on the read side of the memory cell array 11.

The bit line pairs BL1, /BL1 to BLm, /BLm are connected with the read register group 20 through the read side first transfer means group 19. The read side first transfer means group 19 is made up of a plurality of read side first transfer means 19-1 to 19-*m* which correspond to the bit line pairs BL1,/BL1 to BLm, /BLm, respectively. The read register group 20 is made up of a plurality of read registers Rreg-1 to Rreg-m which correspond to the bit line pairs BL1, /BL1 to BLm, /BLm, respectively.

Each of the read side first transfer means 19-1 to 19-*m* is made up of two transistors. For instance, the bit line BL1 is connected with the read register Rreg-1 through the drain and source of one transistor forming the read side first transfer means 19-1 while the bit line /BL1 is connected with the read register Rreg-1 through the drain and source of the other transistor forming the read side first transfer means 19-1. The ON/OFF control of 2×m transistors forming the read side first transfer means 19-1 to 19-*m* is carried out with a control signal RT.

The read register group 20 is connected with read data buses RD, /RD through the read side second transfer group 21. This read side second transfer means group 21 is made up of a plurality of read side second transfer means 21-1 to 21-*m* respectively corresponding to the read registers Rreg-1 to Rreg-m, which make up the read register group 20.

Each of the read side second transfer means 21-1 to 21-*m* is made up of two transistors. For instance, the read register Rreg-1 is connected with read data buses RD, /RD through respective drains and sources of two transistors forming the read side second transfer means 21-1. Each of the read Y-address signals YR1 to YRm outputted from the read Y-address means 15 is inputted to each of the read side second transfer means 21-1 to 21-m, and the ON/OFF control of two transistors forming each of the read side second transfer means 21-1 to 21-m is carried out with the read Y-address signals YR1 to YRm.

The read data buses RD, /RD are connected with an output terminal DOUT through the output means 123.

The input/output means 122 located on the write side is connected with the output means 123 located on the read side through the second data buses RD2, /RD2.

Figure 2:
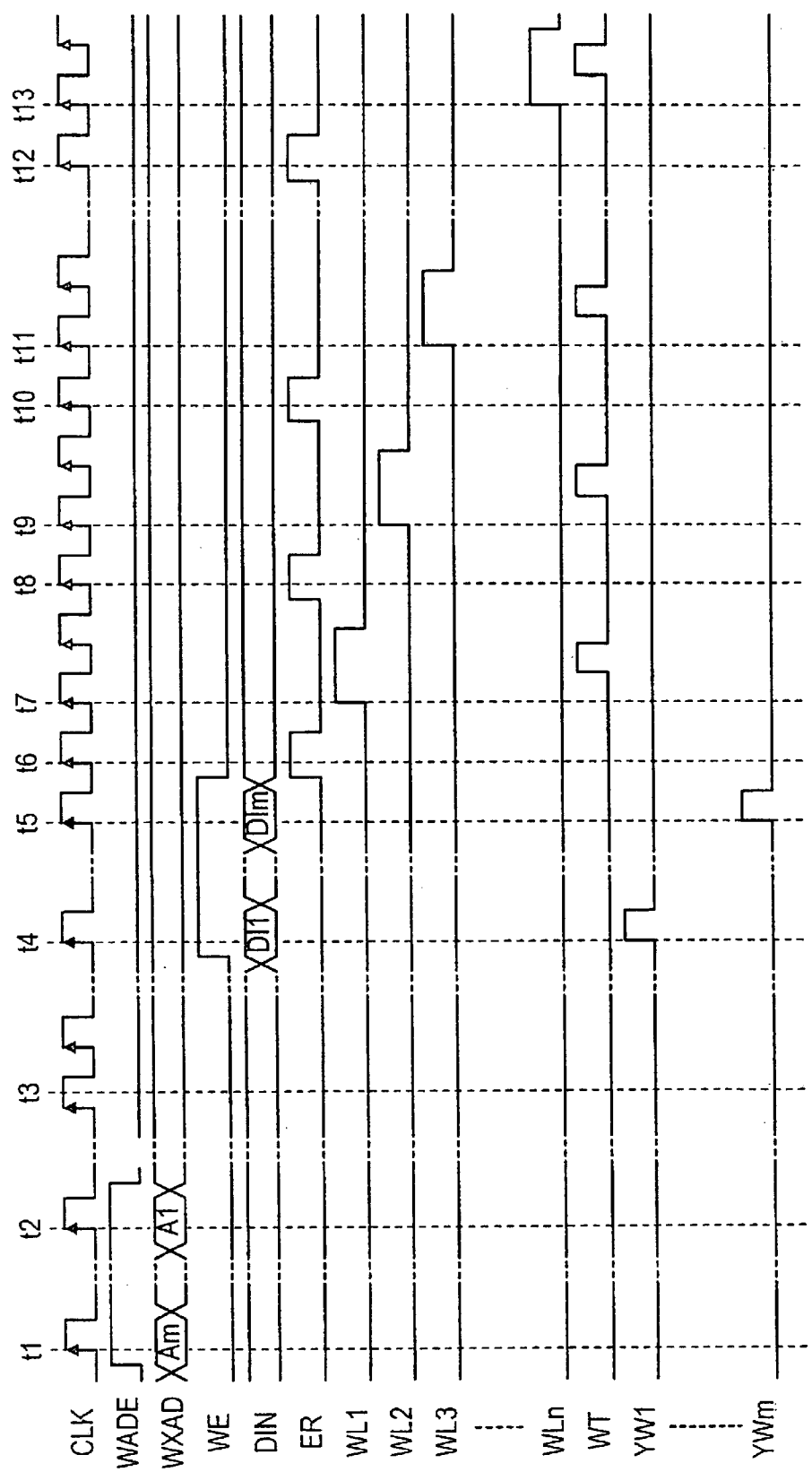
FIG. 2 is a timing chart for describing the test write operation of the serial access memory illustrated in FIG. 1.
Figure 3:
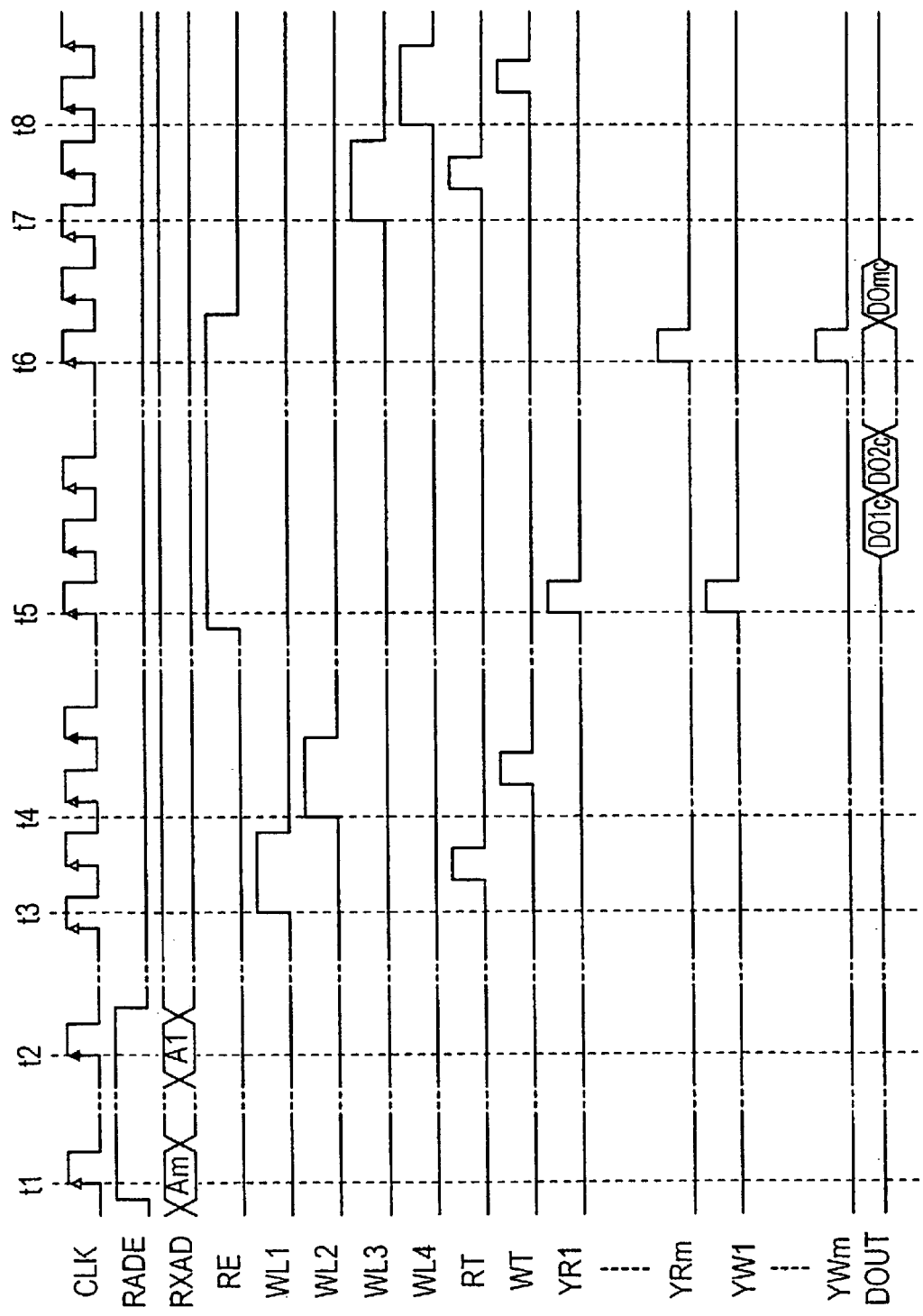
FIG. 3 is a timing chart for describing the test read operation of the serial access memory illustrated in FIG. 1.

The operation of the serial access memory 101 as arranged above will now be describe with reference to FIGS. 2 and 3. This serial access memory 101 is prepared for the purpose of reducing the test time thereof, so that the data write/read operation thereof will be described in connection with the test by which it is judged whether or not a predetermined data as written in the serial access memory 101 can be correctly read out without any failure.

FIG. 2 is a timing chart for describing the write operation executed during the test of the serial access memory 101, that is, the test write operation. The test write operation will be described with the passage of time as indicated in the figure.

<Time t1> In starting the test write operation, a test mode signal TM is inputted to the memory control portion 112. The test write operation is commenced by serially inputting a write X-address WXAD to the memory control portion 112. At this stage, however, a write address enable signal WADE of the H-level is inputted in advance to the memory control portion 112 in order to make it possible for the memory control portion 112 to take in the write X-address WXAD. To begin with, at time t1, the most significant bit (MSB) data Am of the write X-address WXAD is taken in the memory control portion 112, and thereafter, each bit data of the write X-address WXAD is taken in sequence in the memory control portion 112 in synchronism with a clock signal CLK.

<Time t2> Then, the least significant bit (LSB) data A1 of the write X-address WXAD is taken in the memory control portion 112, thereby the take-in operation of the write X-address WXAD being completed. At this stage, the write address enable signal WADE to be inputted to the memory portion 112 is put in the L-level. In this test write operation, the word line WL1 is first selected with the write X-address WXAD.

Figure 12:
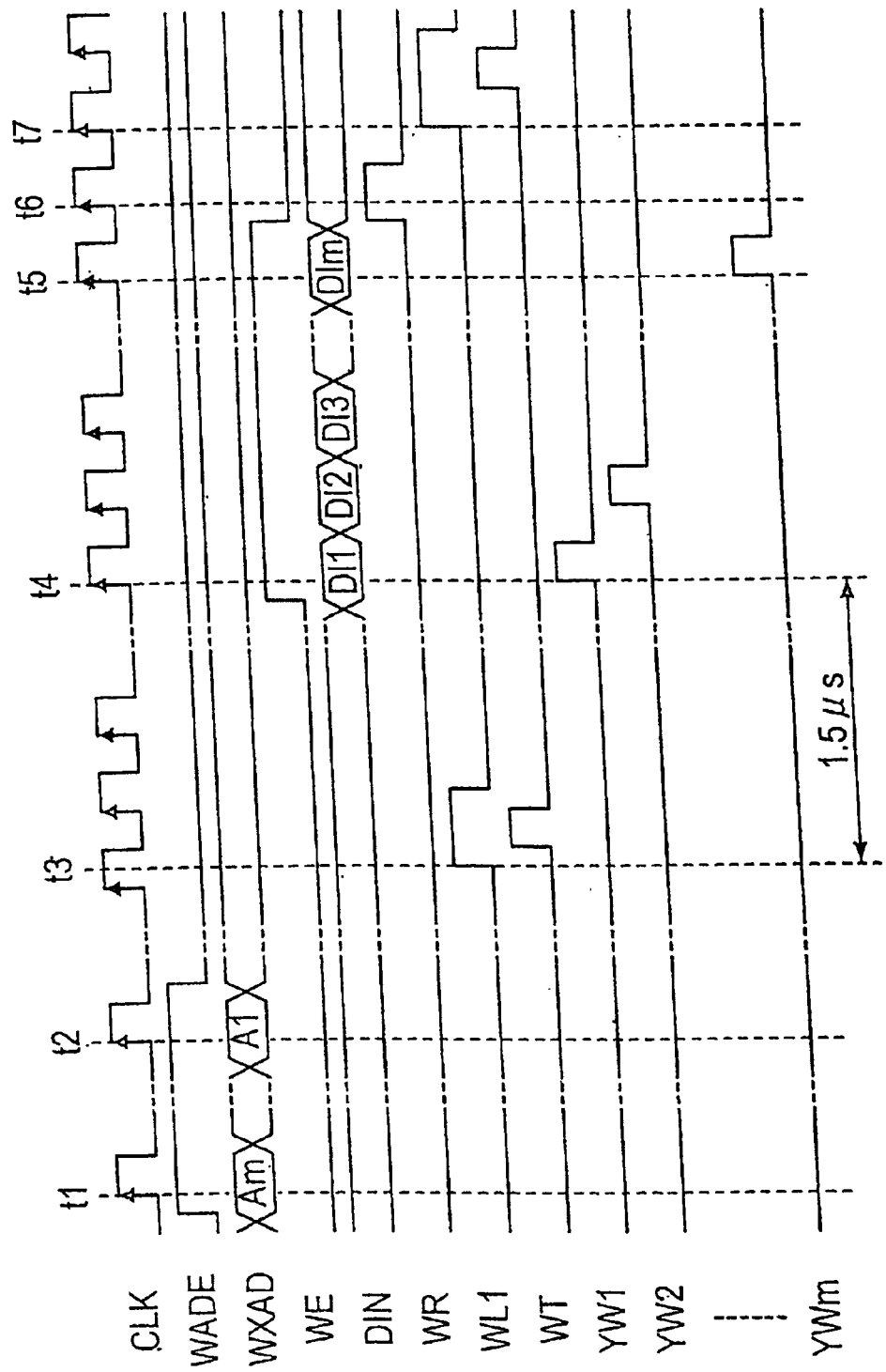
FIG. 12 is a timing chart for describing the write operation of the prior art serial access memory shown in FIG. 11.
Figure 13:
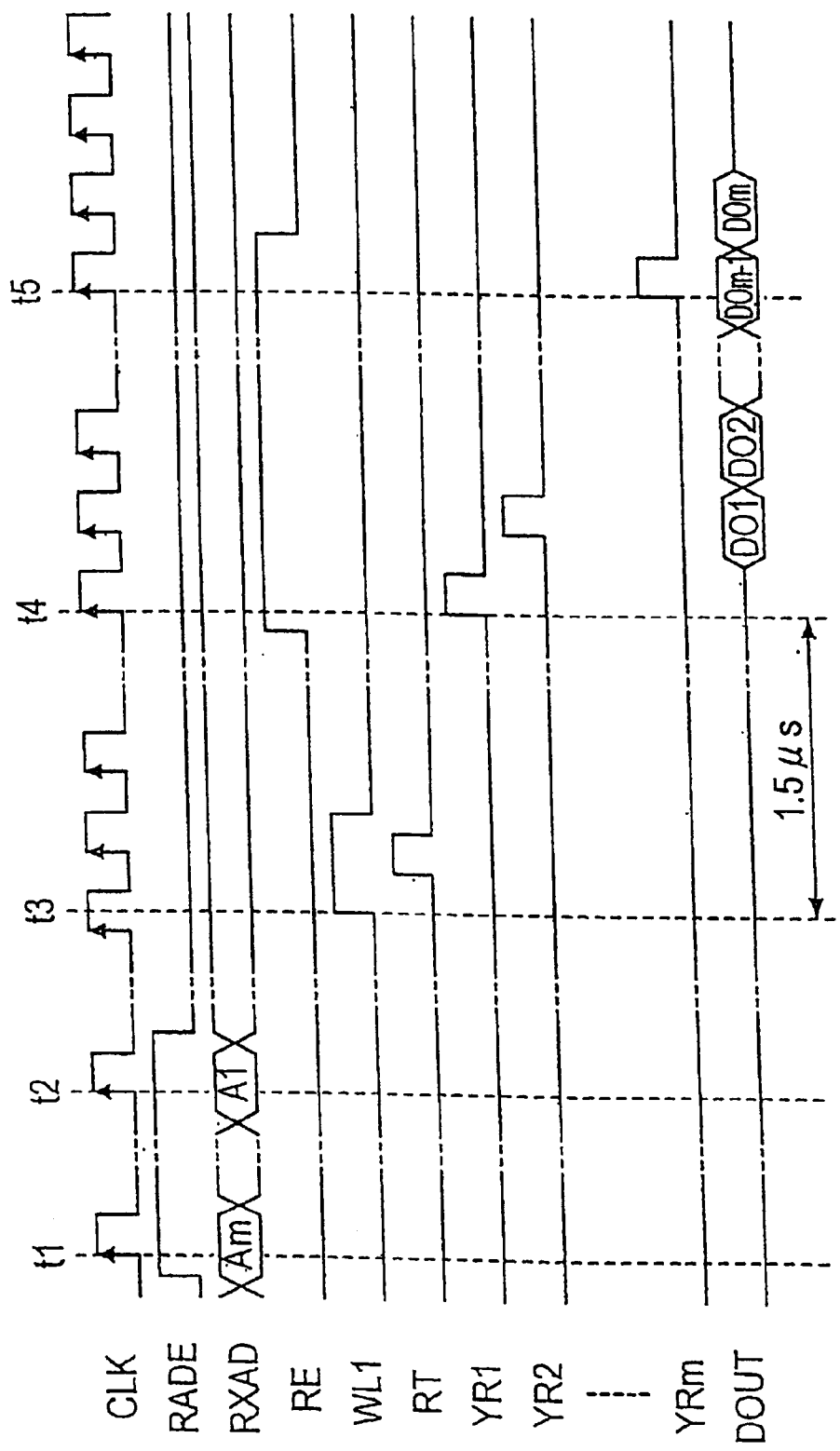
FIG. 13 is a timing chart for describing the read operation of the prior art serial access memory shown in FIG. 11.

<Time t3> As described before, the write mask operation is carried out in the write operation of the prior art serial access memory 1 as shown in FIG. 12. However, no data is stored in each of the memory cells MC11 to MCmn of the serial access memory 101 under the test write operation, in other words, each memory cell remains in the initial state. Therefore, the write mask operation is not an indispensable matter, thus enabling the write mask operation to be omitted here.

<Time t4> The memory control portion 112 detects the write enable signal WE of the H-level in the rise timing of the clock signal CLK. With this, the substantial test write operation is commenced. The write Y-address means 14 selects the write Y-address signal YW1 from the write Y-address signals YW1 to YWm and puts it in the H-level. At this time, the input data DI1 inputted from the input terminal DIN is transmitted to the write data buses WD, /WD through the input/output means 122. Since the write side second transfer means 18-1 is put in the ON state with the write Y-address signal YW1 of the H-level, the input data DI1 is stored in the write register Wreg-1.

<Time t4 to t5> Up to time t5 after time t4, the write Y-address means 14 selects in sequence the write Y-address signals YW2 to YWm from the write Y-address signals YW1 to YWm in synchronism with the clock signal CLK and puts each of them in the H-level. On one hand, the input data DI2 to DIm are being inputted in sequence to the input terminal DIN, and each of the input data DI2 to DIm is stored in each of the write registers Wreg-2 to Wreg-m, correspondingly.

<Time t6> The write reset signal WR of the H-level being inputted to the memory control portion 112, there is commenced the transfer of the input data DI1 to DIm stored in the write register group 17 to the memory cell array 11.

<Time t7> The word line WL1 selected in the period of time t1 through t2 is put in the H-level by the X-address means 13 and further, the control signal WT is put in the H-level by the memory control portion 112. As the result of this, the input data DI1 to DIm stored in the write register group 17 are transferred all at once to the memory cells MC11 to MCm1 connected with the word line WL1.

<Time t8> Again, the write reset signal WR of the H-level being inputted to the memory control portion 112, there is commenced the transfer of the input data DI1 to DIm stored in the write register group 17 to the memory cell array 11.

<Time t9> The word line WL2 having an address next to that of the word line WL1 selected in the period of time t1 through t2 is put in the H-level by the X-address means 13 and further, the control signal WT is put in the H-level by the memory control portion 112. As the result of this, the input data DI1 to DIm stored in the write register group 17 are transferred all at once to the memory cells MC12 to MCm2 connected with word line WL2.

<Time t10 to t13> The almost same operation as has been executed in the period of time t6 through t9 is repeated incrementing the X-address by one each. At time t13, the input data DI1 to DIm stored in the write register group 17 are transferred all at once to the memory cells MC1n to MCmn connected with the word line WLn, thereby completing the transfer of the input data DI1 to DIm from the write register group 17 to the memory cell array 11. With this transfer operation, the same input data DI1 to DIm are stored in all the memory cells MC11 to MCmn connected with the word lines WL1 to WLn on the word line by word line basis.

As described above, according to the test write operation of the serial access memory 101 as shown in FIG. 2, the write operation for writing the input data DI1 to DIm to the write register group 17 is executed only once, and the input data DI1 to DIm written in the write register group 17 are then transferred to all the memory cells MC11 to MCmn. Therefore, the time needed for storing the data in all the memory cells MC11 to MCmn can be reduced to a great extent as compared with the prior art write operation in which the input data is written in the write register group 17 on the word line by word line basis.

FIG. 3 is a timing chart for describing the read operation executed during the test of the serial access memory 101, that is, the test read operation executed following the test write operation as shown in FIG. 2. The test read operation will be described with the passage of time as indicated in the figure.

<Time t1> In starting the test read operation, a test mode signal TM is inputted to the memory control portion 112. The test read operation is commenced by serially inputting a read X-address RXAD to the memory control portion 112. At this stage, a read address enable signal RADE of the H-level is inputted in advance in order to make it possible for the memory control portion 112 to take in the read X-address RXAD. To begin with, at time t1, the most significant bit (MSB) data Am of the read X-address RXAD is taken in the memory control portion 112, and thereafter, each bit data of the read X-address RXAD is taken in the memory control portion 112 in sequence in synchronism with a clock signal CLK.

<Time t2> The least significant bit (LSB) data A1 of the read X-address RXAD is taken in the memory control portion 112, thereby the take-in operation of the read X-address RXAD being completed. At this stage, the read address enable signal RADE to be inputted to the memory control portion 112 is put in the L-level. In this test read operation, the word line WL1 is first selected with the read X-address RXAD.

<Time t3> The word line WL1 selected at time t2 is put in the H-level by the X-address means 13, and further, the control signal RT is put in the H-level by the memory control portion 112. As the result of this, each data stored in the memory cells MC11 to MCm1 connected with the word line WL1 is transferred all at once to the read registers Rreg-1 to Rreg-m through the read side first transfer means group 19.

<Time t4> After the data stored in the memory cells MC11 to MCm1 connected with the word line WL1 is transferred all at once to the read registers Rreg-1 to Rreg-m, the word line WL2 is put in the H-level by the X-address means 13 at time 4, and the control signal WT is also put in the H-level by the same. As the result of this, the data stored in the memory cells MC12 to MCm2 connected with the word line WL2 is transferred all at once to the write registers Wreg-1 to Wreg-m through the write side first transfer means group 16. In this way, the write registers Wreg-1 to Wreg-m are used as a temporary data storage means for storing the data as read out from the memory cells MC12 to MCm2.

<Time t5> The memory control portion 112 detects the read enable signal RE of the H-level in the rise timing of the clock signal CLK. With this, the substantial read operation is commenced.

The read Y-address means 15 selects a read Y-address signal YR1 from the read Y-address signals YR1 to YRm and puts it in the H-level. Since the read side second transfer means 21-1 is put in the ON state with the read Y-address signal YR1 of the H-level, the data stored in the read register Rreg-1 is transmitted to the output means 123 through the read data buses RD, /RD.

In the same timing, the write Y-address means 14 selects the write Y-address signal YW1 from the write Y-address signals YW1 to YWm and puts it in the H-level. Since the write side second transfer means 18-1 is put in the ON state with the write Y-address signal YW1 of the H-level, the data stored in the write register Wreg-1 is transmitted to the input/output means 122 through the write data buses WD, /WD, and further transmitted to the output means 123 through the second read data buses RD2, /RD2.

The output means 123 compares the data transmitted from the read data buses RD, /RD with the data transmitted from the second read data buses RD2, /RD2 and determines if they coincide with each other or not. The comparison result is outputted from the output terminal DOUT as an output data DO1c. A comparison means provided in the output means 123 maybe an exclusive-OR gate (ExOR), for instance.

<Time t5 to t6> Up to time t6 after time t5, the read Y-address means 15 selects in sequence the read Y-address signals YR2 to YRm from the read Y-address signals YR1 to YRm in synchronism with the clock signal CLK and puts each of them in the H-level. As this goes on, each data stored in the read registers Rreg-2 to Rreg-m is transmitted in sequence to the output means 123 through the read data buses RD, /RD. In the same manner, the write Y-address means 14 selects in sequence the write Y-address signals YW2 to YWm from the write Y-address signals YW1 to YWm in synchronism with the clock signal CLK and put seach of them in the H-level. As this goes on, each data stored in the write registers Wreg-2 to Wreg-m is transmitted to the output means 123 through the input/output means 122 and the second read data buses RD2, /RD2. The output means 123 compares the data transmitted from the read data buses RD, /RD with the data transmitted from the second read data buses RD2, /RD2 and judges if they coincide with each other or not. The comparison result is outputted from the output terminal DOUT as an output data DO2c, DO3c, . . . , and DOmc.

<Time t7 and thereafter> In the period of time t2 through time t6, the data stored in the memory cells MC11 to MCm1 connected with the word line WL1 is compared with the data stored in the memory cells MC12 to MCm2 connected with the word line WL2. In the same manner, at time t7, time t8 and thereafter, the data stored in the memory cells connected with each word line WL3 to WLn is compared with each other with respect to each paired line made up of two word lines, that is, a pair of WL3 & WL4, WL5 & WL6, . . . , and so on.

As described above, according to the test read operation of the serial access memory 101 shown in FIG. 3, the data written to each of the memory cells MC11 to MCmn by the test write operation shown in FIG. 2 and stored therein are read out, thereby judging whether or not the data are correctly stored.

In case of the read operation of the prior art serial access memory 1, the data stored in the memory cells connected with each word line is transferred to the read register group 20 on the word line by word line basis. Consequently, in order to read out the data stored in all the memory cells MC11 to MCmn, the wait time corresponding to the number of word lines has to be expended. In this respect, according to the test read operation of the serial access memory 101 according to the current embodiment, the data stored in the memory cells connected with one word line of the paired word lines is transferred to the read register group 20 while the data stored in the memory cells connected the other word line is transferred to the write register group 17. And the data stored in the read register group 20 and the data stored in the write register group 17 are compared with each other by the output means 123 on the bit by bit basis. As the result of this, the wait time can be reduced to about a half, and the time required for the test read operation can be reduced to a great extent.

As will be understood from the above description, according to the structure of the serial access memory 101 and the test write/read operation thereof of the invention, a large amount of time reduction can be obtained as compared with the time spent in the write/read operation of the prior serial access memory 1 in which a predetermined data is written to all the memory cells MC11 to MCmn and is then read out those data stored in all the memory cells MC11 to MCmn.

In the next, there will be described another embodiment of the serial access memory 101 and the test read operation applicable thereto.

As discussed in the above, in the test read operation of the serial access memory 101 according to the first embodiment of the invention, as shown in FIG. 3, the read Y-address signals YR1 to YRm are selected in sequence and put in the H-level by the read Y-address means 15 at time t5 and thereafter. In the same timing, the write Y-address signals YW1 to YWm are also selected in sequence and put in the H-level by the write Y-address means 14. With this, the data train stored in the read register group 20 and the same stored in the write register group 17 are transmitted to the output means 123 on the basis of bit by bit, and are compared with each other by the data comparison means provided in the output means 123 on the bit by bit basis.

Instead of the above, however, it is possible to adopt a method in which the sequential selection of the read Y-address signals YR1 to YRm by the read Y-address means 15 and the sequential selection of the write Y-address signals YW1 to YWm by the write Y-address means 14 are executed alternately. According to this method, each data stored in the read register Rreg-1 to Rreg-m and each data stored in the write register Wreg-1 to Wreg-m come to be alternately transmitted to the output means 123. The output means 123, if provided with a switch means, can alternately output the data transmitted from the read data buses RD, /RD and the data transmitted from the second read data buses RD2, /RD2 from the output terminal DOUT by means of that switch means. Accordingly, there is no need for the output means 123 to be provided with any data comparison circuit. This allows the output means 123 to have a more compact structure.

Furthermore, the sequential selection of the write Y-address signals YW1 to YWm by the write Y-address means 14 maybe carried out after finishing the sequential selection of the read Y-address signals YR1 to YRm by the read Y-address means 15. According to this method, each data stored in the write registers Wreg-1 to Wreg-m is transmitted to the output means 123 after all data stored in the read Y-address registers Rreg-1 to Rreg-m have been transmitted to the output means 123. In this case, the control of the read Y-address means 15 and the write Y-address means 14 are made easier as compared with the case where the sequential selection of the read Y-address signals YR1 to YRm by the read Y-address means 15 and the sequential selection of the write Y-address signals YW1 to YWm by the write Y-address means 14 are carried out alternately. As the result of this, the scale of the memory control portion 112 can be reduced in both of the hardware and the software thereof.

[Second Embodiment]

Figure 4:
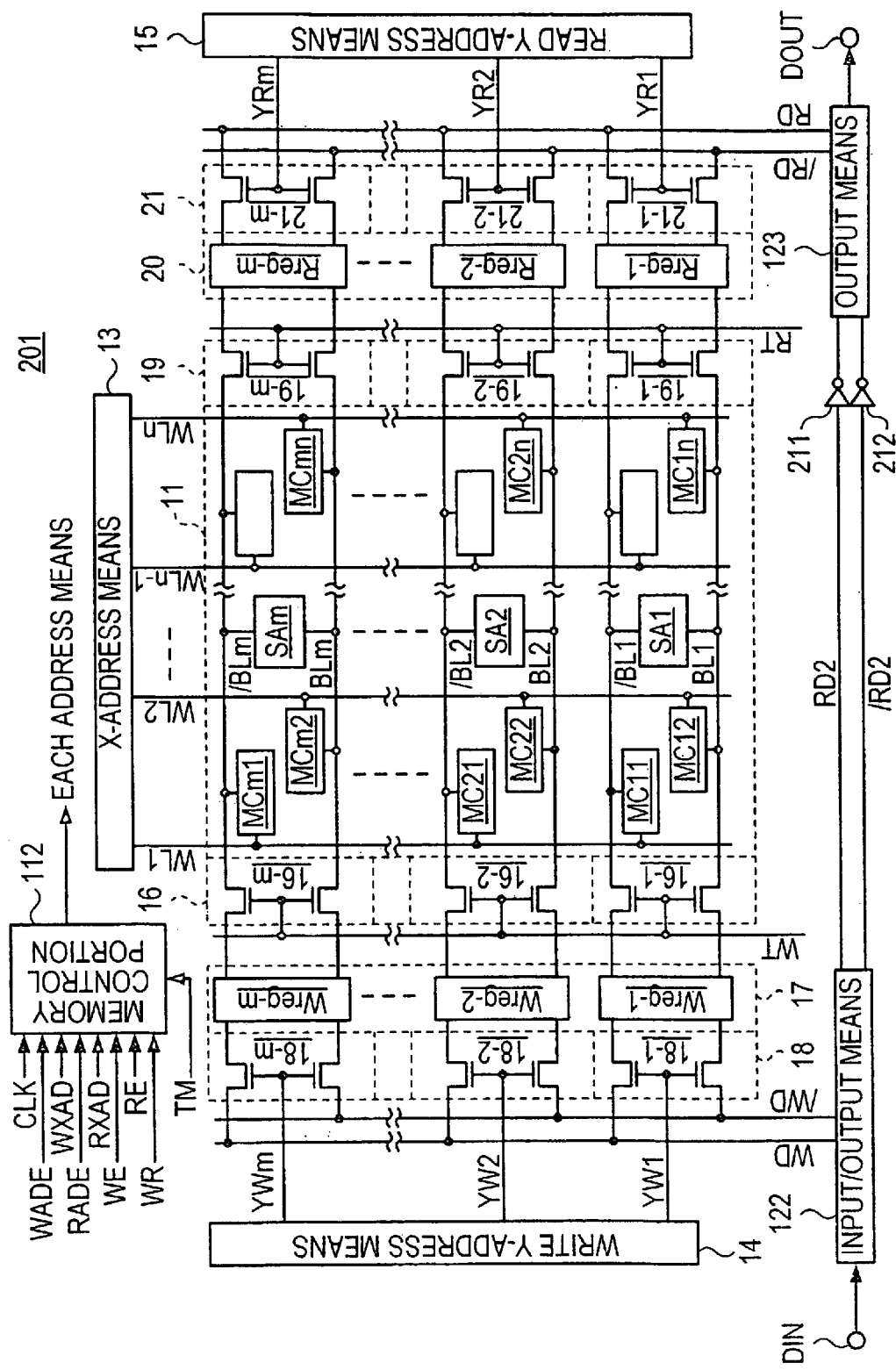
FIG. 4 is a circuit diagram for showing the constitution of a serial access memory according to the second embodiment of the invention.

FIG. 4 is a diagrammatic view showing the structure of a serial access memory 201 according to the second embodiment of the invention.

This serial access memory 201 can be made up by adding two inverters 211, 212 to the serial access memory 101 according to the first embodiment of the invention. These inverters 211, 212 are arranged between the second read data buses RD2, /RD2 and the output means 123. These inverters invert the logical level of the data outputted from the input/output means 122 to the second read data buses RD2, /RD2 and supply the data having the inverted logical level to the output means 123. As to the parts other than the inverters 211, 212, the serial access memory 201 has the same structure and parts as the serial access memory 101.

The operation of the serial access memory 201 as arranged above will be described with reference to FIG. 5. The serial access memory 201 is provided for the purpose of reducing the test time thereof. Therefore, the write/read operation will be described in connection with the test for determining whether or not a predetermined data as written in the serial access memory 201 can be correctly read out without any failure.

Figure 5:
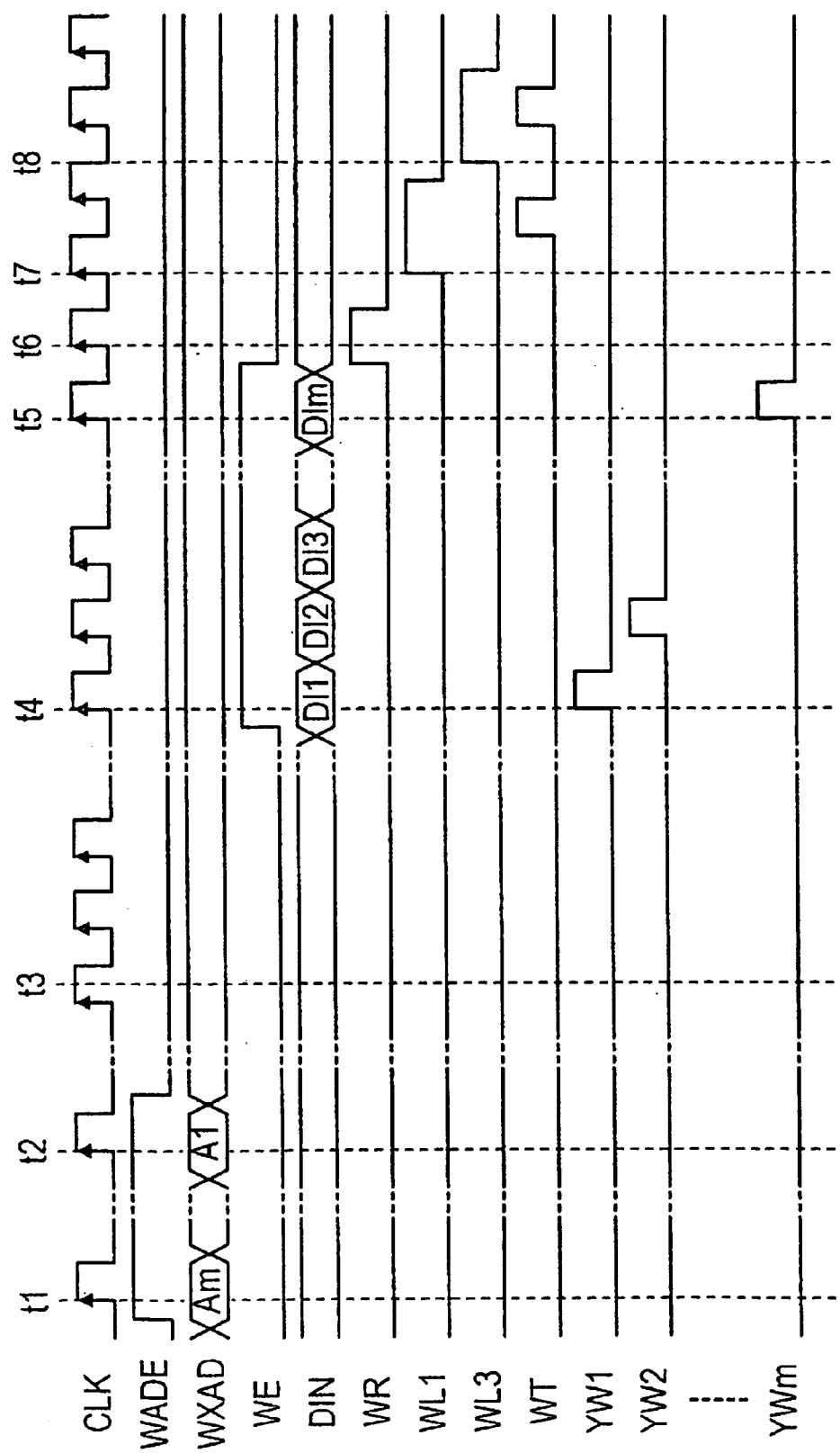
FIG. 5 is a timing chart for describing the test write operation of the serial access memory illustrated in FIG. 4.

FIG. 5 is a timing chart for describing the test write operation executed during the test of the serial access memory 201. The test write operation will be described with the passage of time as indicated in the figure.

<Time t1> In starting the test write operation, a test mode signal TM is inputted to the memory control portion 112. The test write operation is commenced by serially inputting a write X-address WXAD to the memory control portion 112. At this stage, however, a write address enable signal WADE of the H-level is inputted in advance to the memory control portion 112 in order to make it possible for the memory control portion 112 to take in the write X-address WXAD. To begin with, at time t1, the most significant bit (MSB) data Am of the write X-address WXAD is taken in the memory control portion 112, and thereafter, each bit data of the write X-address WXAD is taken in sequence in the memory control portion 112 in synchronism with a clock signal CLK.

<Time t2> The least significant bit (LSB) data A1 of the write X-address WXAD is taken in the memory control portion 112, thereby the take-in operation of the write X-address WXAD being completed. At this stage, the write address enable signal WADE to be inputted to the memory portion 112 is put in the L-level. In this test write operation, the word line WL1 is first selected with the write X-address WXAD.

<Time t3> As described before, the write mask operation is carried out in the write operation of the prior art serial access memory 1 as shown in FIG. 12. However, no data is stored in each of the memory cells MC11 to MCmn of the serial access memory 101 under the test write operation, in other words, each memory cell remains in the initial state, so that the write mask operation is not an indispensable matter. Thus, the write mask operation can be omitted here.

<Time t4> The memory control portion 112 detects the write enable signal WE of the H-level in the rise timing of the clock signal CLK. With this, the substantial write operation is commenced. The write Y-address means 14 selects the write Y-address signal YW1 from the write Y-address signals YW1 to YWm and puts it in the H-level. At this time, the input data DI1 inputted from the input terminal DIN is transmitted to the write data buses WD, /WD through the input/output means 122. Since the write side second transfer means 18-1 is put in the ON state by the write Y-address signal YW1 of the H-level, the input data DI1 is stored in the write register Wreg-1.

<Time t4 to t5> Up to time t5 after time t4, the write Y-address means 14 selects in sequence the write Y-address signals YW2 to YWm from the write Y-address signals YW1 to YWm in synchronism with the clock signal CLK and puts each of them in the H-level. On one hand, the input data DI2 to DIm are being inputted in sequence to the input terminal DIN, and each of the input data DI2 to DIm is stored in the write registers Wreg-2 to Wreg-m.

<Time t6> The write reset signal WR being inputted to the memory control portion 112, there is commenced the transfer of the input data DI1 to DIm stored in the write register group 17 to the memory cell array 11.

<Time t7> The word line WL1 selected in the period of time t1 through t2 is put in the H-level by the X-address means 13 and further, the control signal WT is put in the H-level by the memory control portion 112. As the result of this, the input data DI1 to DIm stored in the write register group 17 are transferred all at once to the memory cells MC11 to MCm1 connected with the word line WL1.

<Time t8> After each data stored in the write registers Wreg-1 to Wreg-m is transmitted to the memory cells MC11 to MCm1 connected with the word line WL1, the word line WL3 is put in the H-level by the X-address means 13, and further, the control signal WT is put in the H-level by the memory control portion 112. As the result of this, the input data DI1 to DIm identical to the data transmitted to the memory cells MC11 to MCm1 connected with the word line WL1 are transmitted all at once to the memory cells MC13 to MCm3 connected with the word line WL3.

<Time t8 and thereafter> In the same manner, after the input data DI1 to DIm have been transmitted to the memory cells MC13 to MCm3 connected with the word line WL3, the same input data DI1 to DIm are transmitted to the memory cells MC15 to MCm5, MC17 to MCm7, . . . respectively connected with word lines given an odd number (n), that is, WL5, WL7, . . . , and so on. In this way, the same input data DI1 to DIm are written to all the memory cells connected with the odd numbered word lines.

After the same input data DI1 to DIm have been written to all the memory cells connected with the odd numbered word lines, the serial access memory 201 repeats the similar test write operation as shown in FIG. 5, thereby storing the input data /DI1 to /DIm in the memory cells MC12 to MCm2, MC14 to MCm4, MC16 to MCm6, . . . respectively connected with word lines given an even number (n), that is, WL2, WL4, WL6, . . . , and so on. The input data /DI1 to /DIm are the data obtained by inverting the logical level of the input data DI1 to DIm. For instance, if the input data DI1 is "0", the input data /DI1 becomes "1".

As described above, according to the test write operation of the serial access memory 201, there is stored in each memory cell connected with one word line, the data having the logical level that is obtained by inverting the logical level of the data stored in each memory cell connected with the other word line adjacent to the above one word line.

In this test write operation, the data transfer to all the word lines WL1 to WLn is carried out after the storage operation of the input data to the write register group 17 is carried out once each with respect to the input data DI1 to DIm and the input data /DI1 to /DIm. Therefore, the time required for storing the data in all the memory cells MC11 to MCmn is reduced to a great extent as compared with the write operation of the prior art serial access memory 1 wherein the input data is stored in the write register group 17 every access to each word line.

The serial access memory 201 performs the test read operation following the test write operation as shown in FIG. 5.

The test read operation of the serial access memory 201 is executed in the same manner as that of the serial access memory 101 as shown in FIG. 3. That is, the data stored in the memory cells connected with one of the paired word lines is transferred to the read register group 20 while the data stored in the memory cells connected the other of the paired word lines is transferred to the write register group 17, and the data train stored in the read register group 20 and the data train stored in the write register group 17 are compared with each other by the output means 123 on the bit by bit basis.

However, different from the test write operation of the serial access memory 101 in which the same data train is stored on the word line by word line basis, according to the test write operation of the serial access memory 201, there is stored in the memory cells MC11 to MCm1, MC13 to MCm3, MC15 to MCm5, . . . connected with the odd numbered word lines WL1, WL3, WL5, . . . , and so on, the data having the logical level that is obtained by inverting the logical level of the data stored in the memory cells MC12 to MCm2, MC14 to MCm4, MC16 to MCm6, . . . connected with the even numbered word lines WL2, WL4, WL6, . . . , and so on. For instance, when an input data DI1 to DIm of "0101 . . . 1" is stored in the memory cells MC11 to MCm1 connected with the word line WL1, the input data /DI1 to /DIm of "1010 . . . 0" is stored in the memory cells MC12 to MCm2 connected with the word line WL2. In the test read operation, the data "0101 . . . 1" stored in the memory cells MC11 to MCm1 is transferred to the read register group 20 while the data "1010 . . . 0" stored in the memory cells MC12 to MCm2 is transferred to the write register group 17.

The data train "0101 . . . 1" stored in the read register group 20 is transmitted to the output means 123 on the basis of bit by bit, through the read data buses RD, /RD.

On one hand, the data train "1010 . . . 0" stored in the write register group 17 is transmitted to the input/output means 122 on the basis of bit by bit through the write data buses WD, /WD and is further transmitted to the output means 123 through the second read data buses RD2, /RD2 and the inverters 211, 212 as well. Since the data train "1010 . . . 0" stored in the write register group 17 passes through the inverters 211, 212 on the way to the output means 123, the logical level thereof is inverted passing there through and then inputted to the output means 123 as the data train "0101 . . . 1".

The output means 123 compares the data transmitted from the read data buses RD, /RD with the data transmitted from the second read data buses RD2, /RD2 and determines if they coincide with each other or not. At this time, since the logical level of the data from the second read data buses RD2, /RD2 is inverted in advance by the inverters 211, 212, the comparison means provided in the output means 123 can compare the data from the second read data buses RD2, /RD2 with the data from the read data buses RD, /RD, leaving the data from the second read data buses RD2, /RD2 as it stands. The comparison result is outputted as the output data DO1c from the output terminal DOUT.

In the same way that word lines WL1 and WL2 are paired, two adjacent word lines of the word lines WL3 to WLn are paired, and the data stored in the memory cells connected with each of those paired word lines are compared with each other by means of the output means 123 on the pair by pair basis.

As described above, according to the test read operation of the serial access memory 201, the data stored in each of the memory cells MC11 to MCmn in the test write operation as shown in FIG. 5 is read out and judged whether or not the data has been stored correctly.

Furthermore, a plurality of word lines are divided into a plurality of word line pairs of which each is made up of two adjacent word lines, and the data stored in the memory cells connected with one of the paired word line is transferred to the read register group 20 while the data stored in memory cells connected with the other of the paired word line is transferred to the write register group 17. The data train stored in the read register group 20 is compared with the data stored in the write register group 17 by means of the output means 123 on the bit by bit basis. Therefore, the time needed for executing the test read operation is reduced to a great extent as compared with the read operation of the prior art serial access memory 1 in which the storage data is transferred to the read register group 20 every access to each word line and then is read out.

As described above, according to the structure of the serial access memory 201 and the test write/read operation of the invention, a great time reduction can be realized as compared with the write/read operation of the prior art serial access memory 1 in which a predetermined data is written in all the memory cells MC11 to MCmn and the data as stored therein is read out from all the memory cells MC11 to MCmn.

By the way, according to the structure and the test write/read operation of the serial access memory 101 (first embodiment), the same data train is stored in the memory cells connected with each word line. In this case, even though there is obtained in the test such a result that the data stored in the memory cells MC11 to MCm1 connected with the word line WL1 coincides with the data stored in the memory cells MC12 to MCm2 connected with the word line WL2, it might be hardly possible to judge whether or not word lines WL1, WL2 have been rightly selected without any error, relying only on this result in the test write operation or the test read operation. In this respect, according to the structure and the test write/read operation of the serial access memory 201, since the data train having a logical level that is inverted on every other word line, are stored and read to be compared with each other, it becomes naturally possible to judge whether or not the data is correctly stored in each memory cell, and it further becomes possible to judge whether or not the word line is selected rightly.

[Third Embodiment]

Figure 6:
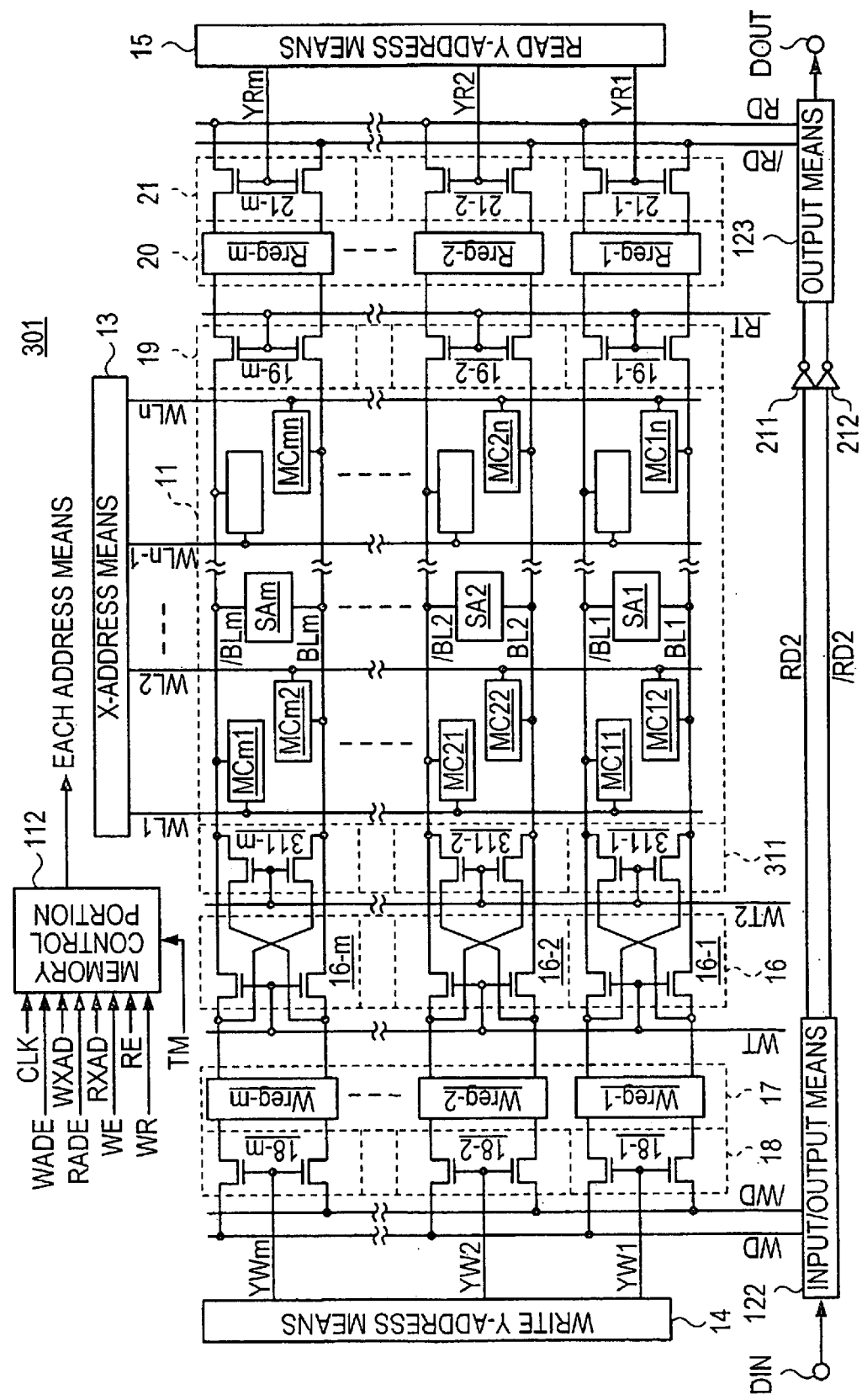
FIG. 6 is a circuit diagram for showing the constitution of a serial access memory according to the third embodiment of the invention.

FIG. 6 is a diagrammatic view showing the structure of a serial access memory 301 according to the third embodiment of the invention.

This serial access memory 301 can be made up by adding a write side third transfer means group 311 to the serial access memory 201 according to the second embodiment of the invention. This write side third transfer means group 311 is made up of write side third transfer means 311-1 to 311-m corresponding to the bit line pairs BL1, /BL1 to BLm, /BLm, respectively.

Each of the write side third transfer means 311-1 to 311-m is made up of two transistors. The ON/OFF control of these 2×m transistors forming the write side third transfer means 311-1 to 311-m is carried out with a control signal WT2.

The serial access memory 301 further includes write side first transfer means 16-1 to 16-m in addition to the write side third transfer means 311-1 to 311-m. The write side first transfer means 16-1 to 16-m serve to connect bit line pairs BL1, /BL1 to BLm, /BLm with write registers Wreg-1 to Wreg-m respectively, and the ON/OFF control thereof is carried out with the control signal WT. In case of transmitting the data stored in the write register group 17 through bit line pairs BL1, /BL1 to BLm, /BLm, either the control signal WT or the control signal WT2 is put in the H-level.

The complementary data is stored in each of the write register Wreg-1 to Wreg-m is stored. This complementary data is transferred to bit line pairs BL1, /BL1 to BLm, /BLm by either the write side first transfer means 16-1 to 16-m or the write side third transfer means 311-1 to 311-m. In the complementary data stored in each of the write registers Wreg-1 to Wreg-m, however, the complementary data outputted to each of bit lines BL1 to BLm when transferred by the write side first transfer means 16-1 to 16-m, is outputted to each of bit lines /BL1 to /BLm when transferred by the write side third transfer means 311-1 to 311-m. Contrary to this, the complementary data outputted to each of bit lines /BL1 to /BLm when transferred by the write side first transfer means 16-1 to 16-m, is outputted to each of bit lines BL1 to BLm when transferred by the write side transfer means 311-1 to 311-m. To put it more concretely, for instance, in case that complementary data "0, 1" are stored in the write register Wreg-1 such that the data "0" is transferred to the bit line BL1 by the write side first transfer means 16-1 while the data "1" is transferred to the bit line /BL1 by the same, if these complementary data are transferred to the bit line pairs BL1, /BL1 by the write side third transfer means 311-1, the data "1" is outputted to the bit line BL1 while the data "0" is outputted to the bit line /BL1.

There will now be described the operation of the serial access memory 301 as arranged above according to the third embodiment. This serial access memory 301 is made up for the purpose of reducing the test time thereof. Therefore, the read operation and the write operation will be described in connection with the test by which it is judged whether or not a predetermined data as written in the serial access memory 301 can be correctly read out without any failure.

Figure 7:
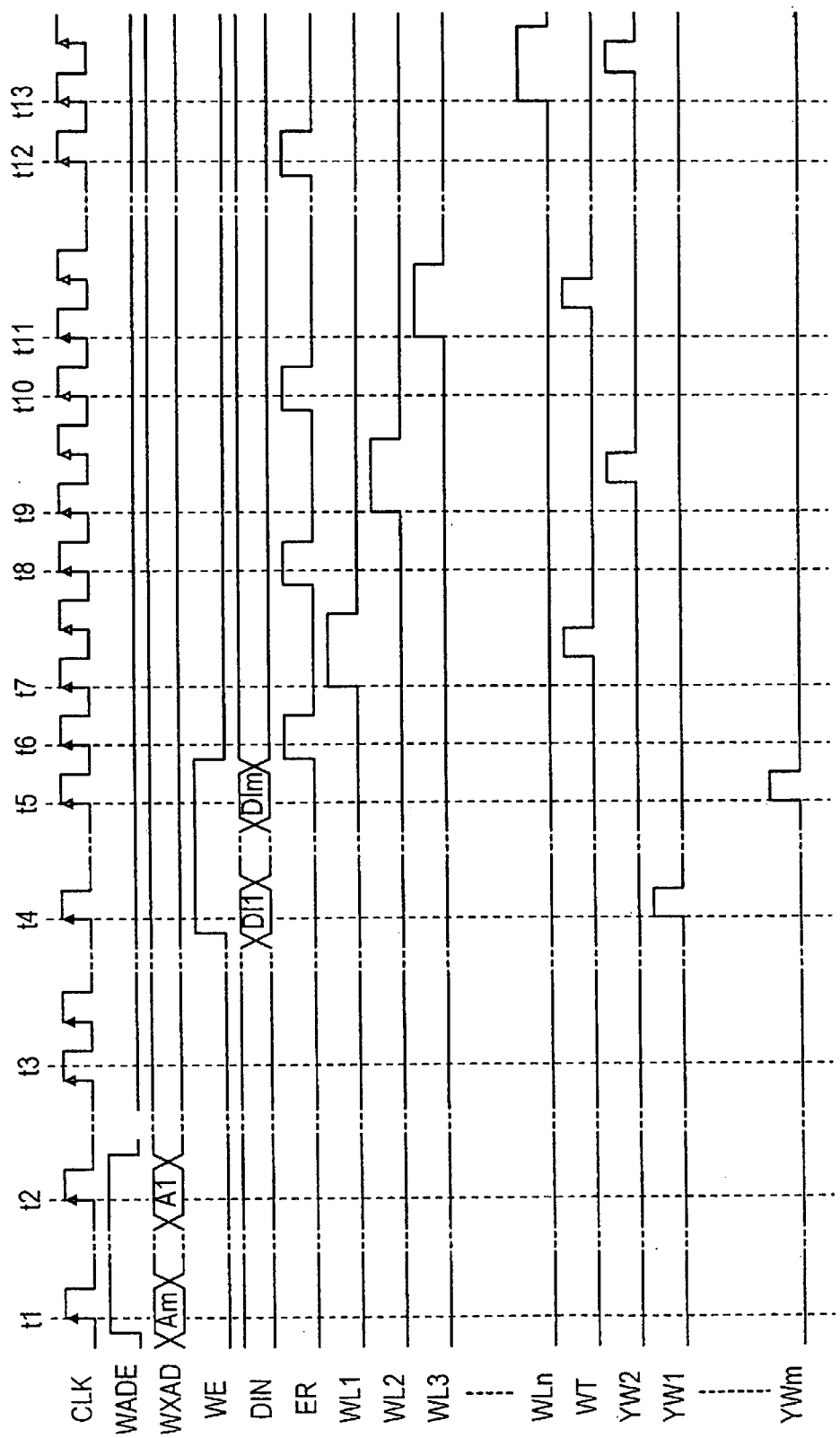
FIG. 7 is a timing chart for describing the test write operation of the serial access memory illustrated in FIG. 6.

FIG. 7 is a timing chart for describing the test write operation of the serial access memory 301, that is. The test write operation will be described with the passage of time as indicated in the figure.

<Time t1> In starting the test write operation, a test mode signal TM is inputted to the memory control portion 112. The test write operation is commenced by serially inputting a write X-address WXAD to the memory control portion 112. At this stage, however, a write address enable signal WADE of the H-level is inputted in advance to the memory control portion 112 in order to make it possible for the memory control portion 112 to take in the write X-address WXAD. To begin with, at time t1, the most significant bit (MSB) data Am of the write X-address WXAD is taken in the memory control portion 112, and thereafter, each bit data of the write X-address WXAD is taken in sequence in the memory control portion 112 in synchronism with a clock signal CLK.

<Time t2> The least significant bit (LSB) data A1 of the write X-address WXAD is taken in the memory control portion 112, thereby the take-in operation of the write X-address WXAD being completed. At this stage, the write address enable signal WADE to be inputted to the memory portion 112 is put in the L-level. In this test write operation, the word line WL1 is first selected with the write X-address WXAD.

<Time t3> As described before, the write mask operation is carried out in the write operation of the prior art serial access memory 1 as shown in FIG. 12. However, no data is stored in each of the memory cells MC11 to MCmn of the serial access memory 101 under the test write operation, in other words, each memory cell remains in the initial state, so that the write mask operation is not an indispensable matter. Thus, the write mask operation can be omitted.

<Time t4> The memory control portion 112 detects the write enable signal WE of the H-level in the rise timing of the clock signal CLK. With this, the substantial test write operation is commenced. The write Y-address means 14 selects the write Y-address signal YW1 from the write Y-address signals YW1 to YWm and puts it in the H-level. At this time, the input data DI1 inputted from the input terminal DIN is transmitted to the write data buses WD, /WD through the input/output means 122. Since the write side second transfer means 18-1 is put in the ON state with the write Y-address signal YW1 of the H-level, the input data DI1 is stored in the write register Wreg-1.

<Time t4 to t5> Up to time t5 after time t4, the write Y-address means 14 selects in sequence the write Y-address signals YW2 to YWm from the write Y-address signals YW1 to YWm in synchronism with the clock signal CLK and puts each of them in the H-level. On one hand, the input data DI2 to DIm are inputted in sequence to the input terminal DIN, and each of the input data DI2 to DIm is stored in the write registers Wreg-2 to Wreg-m.

<Time t6> The write reset signal WR being inputted to the memory control portion 112, there is commenced the transfer of the input data DI1 to DIm stored in the write register group 17 to the memory cell array 11.

<Time t7> The word line WL1 selected in the period of time t1 through t2 is put in the H-level by the X-address means 13 and further, the control signal WT is put in the H-level by the memory control portion 112. As the result of this, the input data DI1 to DIm stored in the write register group 17 are transferred all at once to the memory cells MC11 to MCm1 connected with the word line WL1, through the write side first transfer means 16-1 to 16-m.

<Time t8> Again, the write reset signal WR of the H-level being inputted to the memory control portion 112, there is commenced the transfer of the input data DI1 to DIm stored in the write register group 17 to the memory cell array 11.

<Time t9> The word line WL2 next to the word line WL1 selected in the period of time t1 through t2 is put in the H-level by the X-address means 13 and further, the control signal WT is put in the H-level by the memory control portion 112. As the result of this, the input data DI1 to DIm stored in the write register group 17 are transferred all at once to the memory cells MC12 to MCm2 connected with the word line WL2 through the write side third transfer means 311-1 to 311-m. At this time, there is stored in the memory cells MC12 to MCm2 the data having the logical level that is obtained by inverting the logical level of the data stored in the memory cells MC11 to MCm1.

<Time t10 to t13> In the period of time t10 through t13, the almost same operation as has been carried out in the period of time t6 through t9 is repeated incrementing the X-address by one each. At this stage, however, the control signal WT is put in the H-level when transferring the data to the memory cells MC11 to MCm1, MC13 to MCm3, . . . connected with odd numbered word lines WL1, WL3, . . . , and so on. On one hand, the control signal WT2 is put in the H-level when transferring the data to the memory cells MC12 to MCm2, MC14 to MCm4, . . . connected with even numbered word lines WL2, WL4, . . . , and so on. And, at time t13, the input data DI1 to DIm stored in the write register group 17 are transferred all at once to the memory cells MC1n to MCmn connected with word lines WLn, thereby completing the transfer operation of input data DI1 to DIm from the write register group 17 to the memory cell array 11. With this transfer operation, the input data DI1 to DIm are stored in the memory cells MC11 to MCm1, MC13 to MCm3, . . . connected with odd numbered word lines WL1, WL3, . . . , and so on, while the input data /DI1 to /DIm having the logical level that is obtained by inverting that of the input data DI1 to DIm, are stored in the memory cells MC12 to MCm2, MC14 to MCm4, . . . connected with even numbered word lines WL2, WL4, . . . , and so on.

Following the test write operation described above, the serial access memory 301 executes the test read operation that is the almost same operation as has been performed by the serial access memory 201 according to the second embodiment.

As described above, according to the structure and the test write operation of the serial access memory 301 as shown in FIG. 7, similar to the test write operation of the serial access memory 201 according to the second embodiment, there is stored in each memory cell connected with one word line, the data having the logical level that is obtained by inverting the logical level of the data stored in each memory cell connected with the word line adjacent to the above one word line. Moreover, according to the structure and the test write/read operation of the serial access memory 301, if the storage operation of the input data DI1 to DIm to the write register group 17 is carried out only once, there can be stored the data train having the logical level that is inverted on every other word line can be stored, and these storage data trains can be read out to be compared with each other. Therefore, the time needed for judging whether or not the data is normally stored in each memory cell and whether or not the word line is normally selected as well, is reduced to a great extent as compared with the test write/read operation of the serial access memory 201 according to the second embodiment.

[Fourth Embodiment]

Figure 8:
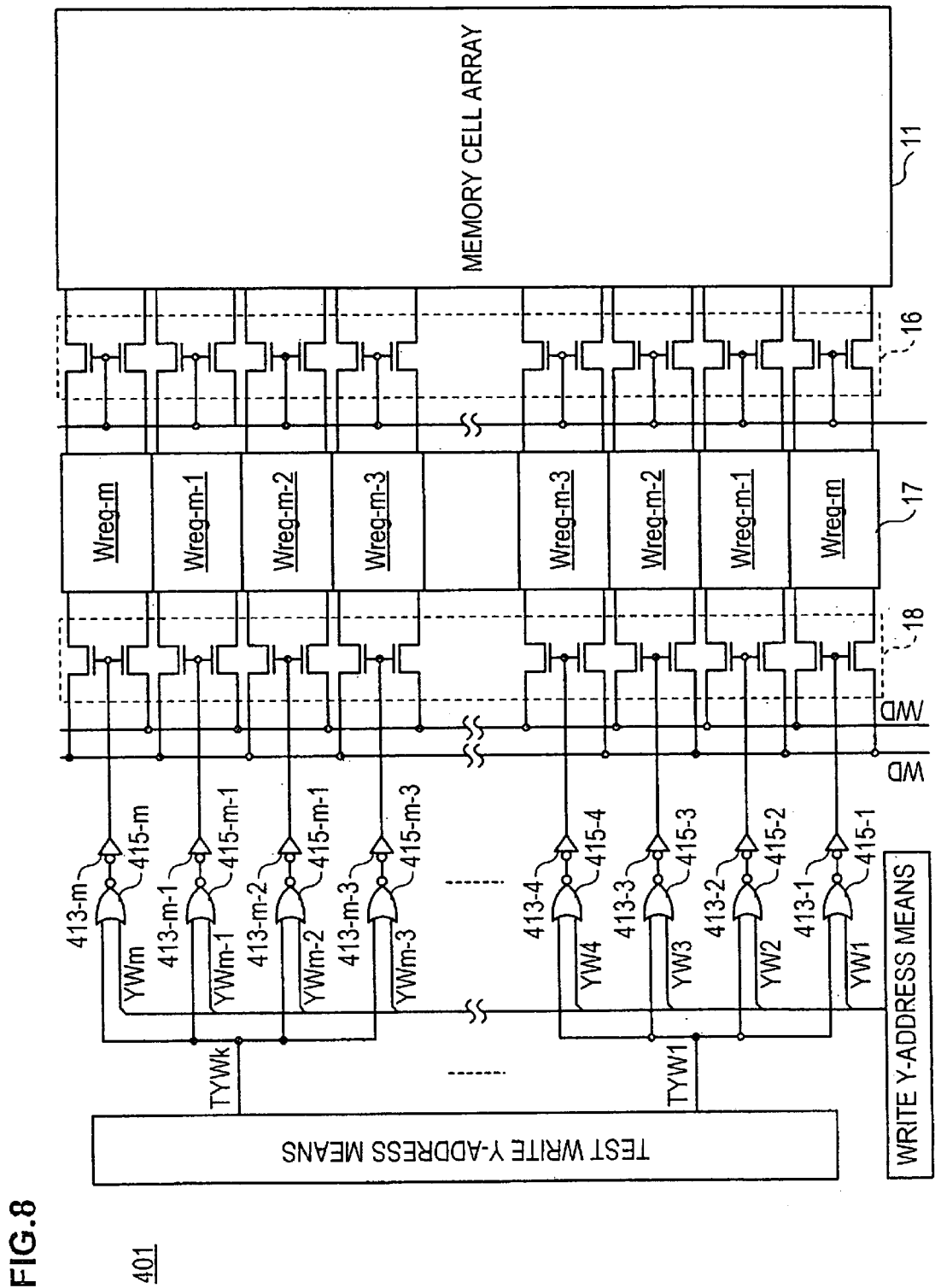
FIG. 8 is a circuit diagram for showing the constitution of a serial access memory according to the fourth embodiment of the invention.

FIG. 8 is a diagrammatic view showing the structure of a serial access memory 401 according to the fourth embodiment of the invention.

This serial access memory 401 can be made up by adding a test write Y-address means 411, inverters 413-1 to 413-m (m pieces), and NOR gates 415-1 to 415-m (m pieces) to the serial access memory 201 according to the second embodiment.

Gates of two transistors making up each of the write side second transfer means 18-1 to 18-m are connected with respective output terminals of the inverters 413-1 to 413-m.

Each output terminal of the NOR gates 415-1 to 415-m is connected with each input terminal of the inverters 413-1 to 413-m. Furthermore, each first input terminal of the NOR gates 415-1 to 415-m is connected with a transmission line for the write Y-address signals YW1 to YWm outputted from the write Y-address means 14.

The NOR gates 415-1 to 415-m are divided into a plurality of groups composed of four NOR gates each. Each second input terminal of the NOR gates 415-1 to 415-4 belonging to the first NOR gate group is commonly connected with the transmission line for the test write Y-address signal TYW1 outputted from a test write Y-address means 411. In the same manner, each second input terminal of the NOR gates 415-5 to 415-m belonging to each NOR gate group from the second group to the kth group (k=m/4) is commonly connected with each transmission line for the test write Y-address signals TYW2 to TYWk outputted from the test write Y-address means 411.

The operation of the serial access memory 401 having the structure as mentioned above will now be described in the following. The serial access memory 401 is made up for the purpose of further reducing the time needed for the test write operation of the serial access memory 201 according to the second embodiment. Accordingly, the following description will be made focusing on the test write operation of the serial access memory 401.

In case of executing the test write operation in the serial access memory 401, all the write Y-address signals YW1 to YWm outputted from the write Y-address means 14 are fixed to the L-level. The test write Y-address means 411 selects in sequence the test write Y-address signals TYW1 to TYWk in synchronism with the clock signal CLK and puts them in the H-level, respectively. At this time, the input data DI1 to DIk are inputted in sequence to the input terminal DIN, and each of the input data DI1 to DIk is stored in the write registers Wreg-1 to Wreg-m. With this data storing operation, four each of the same input data come to be stored in each of the write register Wreg-1 to Wreg-m. For instance, the input data DI1 is stored in each of the write registers Wreg-1 to Wreg-4 while the input data DIk is stored in each of the write registers Wreg-(m-3) to Wreg-m.

After the input data DI1 to DIk are transferred to the write register Wreg-1 to Wreg-m, the serial access memory 401 carries out the almost same test write operation as has been performed by the serial access memory 201 according to the second embodiment. That is, the control signal WT is put in the H-level by the memory control portion 211, and the word lines WL1 to WLn are respectively put in the H-level in sequence by the X-address means 13. The input data DI1 to DIk stored in the write register 17 are transferred to the memory cells MC11 to MCm1, ..., and MC1n to MCmn connected with word lines WL1 to WLn through the write side first transfer means 16-1 to 16-*m* on the word line by word line basis.

According to the serial access memory 401 as described above, the length of the input data DI1 to DIk to be inputted thereto becomes one fourth (¼) of that of the input data DI1 to DIm to be inputted to the serial access memory 201 according to the second embodiment. That is, the time needed for storing the input data DI1 to DIk in the write register Wreg-1 to Wreg-m becomes one fourth as compared with the case of the serial access memory 201. As the result of this, the time needed for the test write operation can be remarkably reduced. In the serial access memory 401, the NOR gates 415-1 to 415-*m* are divided into groups of 4 NOR gates each, but it may be possible to increase or decrease the number of NOR gates included in each group, depending on the contents of the test.

[Fifth Embodiment]

Figure 9:
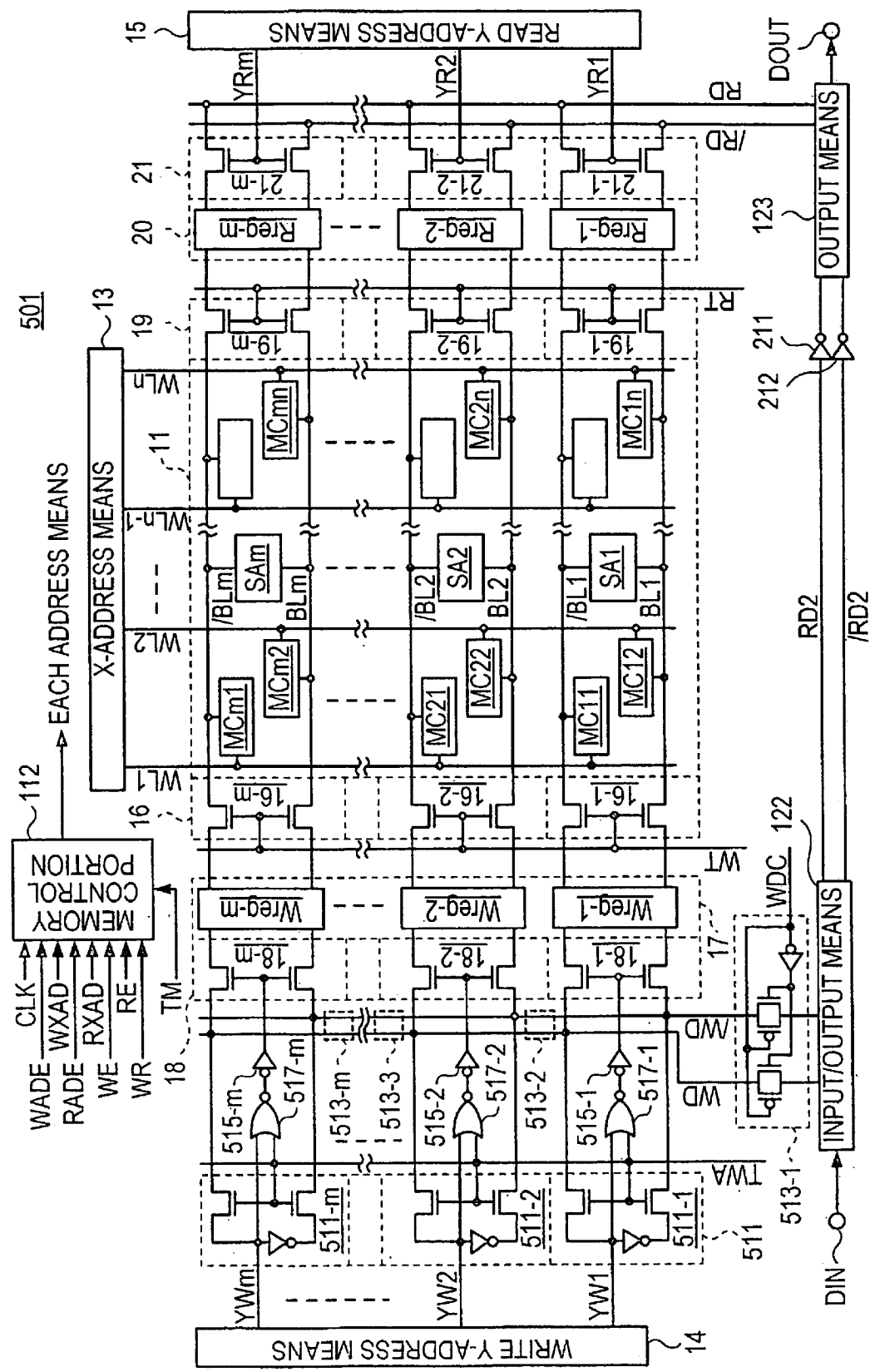
FIG. 9 is a circuit diagram for showing the constitution of a serial access memory according to the fifth embodiment of the invention.

FIG. 9 is a diagrammatic view indicating a serial access memory 501 according to the fifth embodiment of the invention.

The serial access memory 501 can be made up by adding a write side fourth transfer means group 511, write data bus separating means 513-1 to 513-*m*, inverters 515-1 to 515-*m* (m pieces), and NOR gates 517-1 to 517-*m* (m pieces) to the serial access memory 201 according to the second embodiment.

The write side fourth transfer means group 511 is made up of the write side fourth transfer means 511-1 to 511-*m* corresponding to each of the write register Wreg-1 to Wreg-m. Each of the write side fourth transfer means 511-1 to 511-*m* is composed of two transistors and an inverter. For instance, one of two transistors making up the write side fourth transfer means 511-1 transmits the write Y-address signal YW1 outputted from the write Y-address means 14 to the write side second transfer means 18-1, through the drain/source of the above one transistor. The inverter making up the write side fourth transfer means 511-1 inverts the logical level of a write Y-address signal YW1 outputted from the write Y-address means 14 and generates a logical level inverted write Y-address signal /YW1. the other of two transistors making up the write side fourth transfer means 511-1 transmits the inverted write Y-address signal /YW1 to the write side second transfer means 18-1 through the drain/source of the above other transistor. The ON/OFF control of 2×m transistors making up the write side fourth transfer means 511-1 to 511-*m* are carried out with a control signal TWA.

Two gates of the two transistors making up each of the write side second transfer means 18-1 to 18-*m* is connected with each output terminal of the inverters 515-1 to 515-*m*. Each input terminal of the inverters 515-1 to 515-*m* is connected with each output terminal of the NOR gates 517-1 to 517-*m*.

Each first input terminal of the NOR gates 517-1 to 517-*m* is commonly connected with the transmission line of the control signal TWA. Each second input terminal of the NOR gates 517-1 to 517-*m* is connected with each transmission line of the write Y-address signals YW1 to YWm outputted from the write Y-address means 14.

Each of the write data bus separating means 513-1 to 513-*m* is respectively made up of two transfer gates and an inverter. Each first control terminal of two transfer gates commonly receives a control signal WDC while each second terminal of the same commonly receives an inverted logical level signal that is obtained by inverting the logical level of the control signal WDC. When the control signal WDC of the H-level is inputted to the write data bus separating means 513-1 to 513-*m*, the write data buses WD, /WD are separated from the input/output means 122.

The test write operation of the serial access memory 501 as arranged above will be described in the following.

Figure 10:
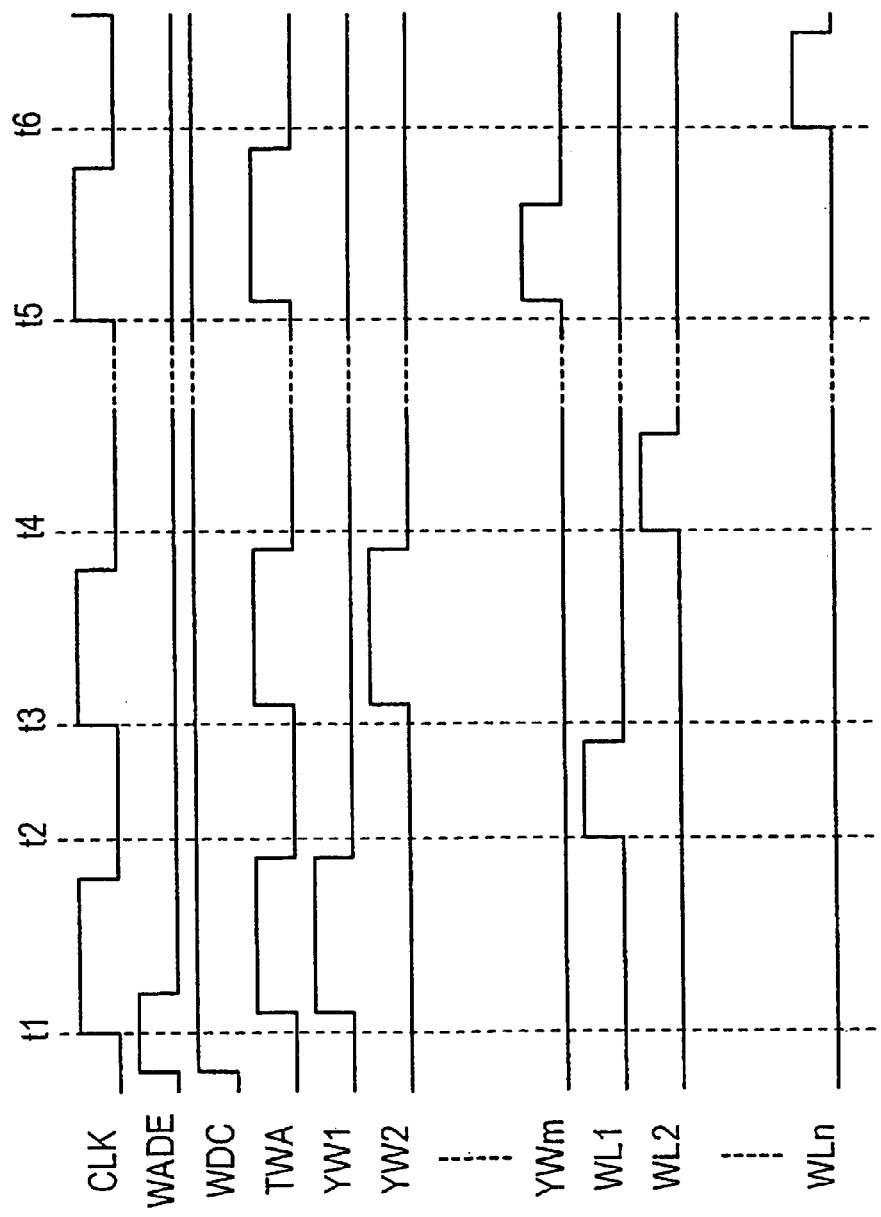
FIG. 10 is a timing chart for describing the test write operation of the serial access memory shown in FIG. 9.
Figure 11:
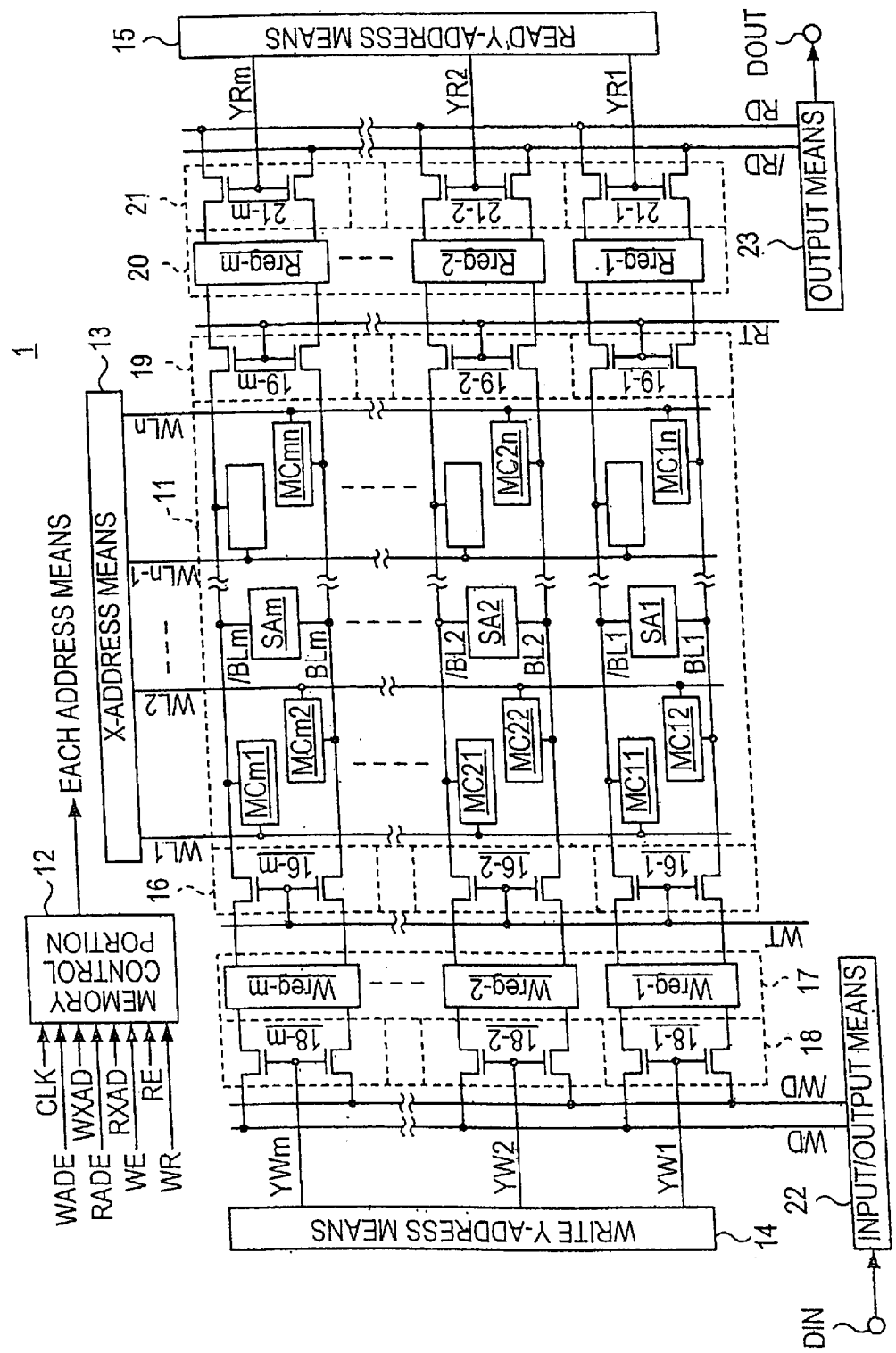
FIG. 11 is a circuit diagram for showing the constitution of a prior art serial access memory.

FIG. 10 is a timing chart for describing the test write operation of the serial access memory 501. The test write operation will be described with the passage of time as shown in the figure.

<Time t1> In starting the test write operation, the control signal WDC of the H-level is inputted to the write data bus separating means 513, thereby separating write data buses WD, /WD from the input/output means 122. The write address enable signal WADE of the H-level is inputted to the memory control portion 112 in the rise timing of the clock signal CLK. The memory control portion 112 instructs the write Y-address means 14 to output the write Y-address signal YW1 of the H-level and the write Y-address signals YW2 to YWm of the L-level as well.

Following the above, the control signal TWA generated from the clock signal CLK becomes the H-level. With this control signal TWA of the H-level, all the 2×m transistors making up the write side fourth transfer means 511-1 to 511-*m* are put in the ON state. Since each second input terminal of the NOR gates 517-1 to 517-*m* is put in the H-level, all the 2×m transistors making up the write side second transfer means 18-1 to 18-*m* are also put in the ON state. Accordingly, the write Y-address signals YW1 to YWm outputted from the write Y-address means 14 are stored, as the data, in the write registers Wreg-1 to Wreg-m, respectively. As described above, since only the write Y-address signal YW1 is in the H-level while the other write Y-address signals YW2 to YWm are in the L-level, the data "1" is stored in the write register Wreg-1 while the data "0" is stored in the write register Wreg-2 to Wreg-m.

<Time t2> The word line WL1 is put in the H-level by the X-address means 13. With this, all the data stored in the write register group 17 are transferred all at once to the memory cells MC11 to MCm1 connected with the word line WL1.

<Time t3> Complying to the instruction from the memory control portion 112, the writ Y-address means 14 outputs the write Y-address signal YW2 of the H-level and the write Y-address signals YW1 and YW3 to YWm of the L-level as well. Since the control signal TWA is the H-level, the data "1" is stored in the write register Wreg-2 while the data "0" is stored in all the write registers Wreg-1 and Wreg-2 to Wreg-m as well.

<Time t4> The word line WL2 is put in the H-level by the X-address means 13. With this, all the data stored in the write register group 17 are transferred all at once to the memory cells MC12 to MCm2 connected with the word line WL2.

<Time t4 to t6> Similar to the test write operation as has been executed up to time t4 from time t1, the write Y-address signals YW3 to YWm outputted from the write Y-address means 14 are put in sequence in the H-level, respectively, and the write Y-address signals YW1 to YWm outputted from the write Y-address means 14 are stored as the data in the write register Wreg-1 to Wreg-m. Furthermore, the data stored in the write register group 17 are transferred all at once to the memory cells MC13 to MCm3, ..., and MC1n to MCmn connected with the word lines WL3 to WLn. In the way like this, at time t6, the data stored in the write register group 17 is transferred all at once to the memory cells MC1n to MCmn connected with word lines WLn, and a series of the test write operation is completed.

As described above, according to the structure and the test write operation of the serial access memory 501, the data "1" is stored in only one memory cell among the m memory cells connected with each of the n word lines while the data "0" is stored in all the other memory cells. As the result of this, when regarding the memory cells MC11 to MCmn making up the memory cell array 11 as a matrix, it will be seen that the data "1" is aligned along the diagonal line of the matrix.

In the serial access memory, when transferring the data all at once from the write registers to the memory cell array or transferring the data all at once from the memory cell array to read registers, there is sometimes observed such a phenomenon that the potential difference between the power source and the ground is made narrower. In general, the phenomenon like this is apt to take place when transferring the data having such a pattern that only one bit of the data has a logical level different from that of the others. However, according to the test write operation of the serial access memory 501, since the data having such a pattern as described above is stored in the memory cell array 11, a so-called data transfer margin can be ascertained by measuring the potential variation taking place during the data transfer. In the serial access memory 501 as described above, the data "1" is stored in the memory cell array 11 such that the data "1" is aligned along the diagonal line of the memory cell array i.e. the memory cell matrix. However, it is possible for the data "0" to be aligned along the diagonal line of the memory cell matrix.

Furthermore, according to the serial access memory 501, since the write Y-address signals YW1 to YWm outputted from the write Y-address means 14 are stored as the data in each of the write register Wreg-1 to Wreg-m, there is no need for any input data to be externally inputted during the test write operation, thus the test time being further reduced as compared with the test time of the serial access memories 101 to 401 as have been described so far according to the first to fourth embodiments of the invention.

The invention has been described in detail with respect to several preferred embodiments of the invention with reference to the accompanying drawings related thereto. As a matter of course, however, the invention is not to be limited to those embodiments. It is apparent that any one who has an ordinary skill in the art may attempt various variations and modifications within the technical category recited in the scope of claim for patent attached hereto, and it is understood that those variations and modifications are naturally within the technical scope of the invention.

As has been described above, according to the invention, the test time of the serial access memory can be reduced to a great extent, and the measurement of the data transfer margin can be more easily carried out.

What is claimed is:

1. A data write/read method for a serial access memory, wherein the serial access memory includes a plurality of memory cells arranged at each of intersections made by a plurality of word lines and a plurality of bit lines, a first register having a capacity capable of storing one word data stored in said plural memory cells connected with each of in said plural memory cells connected with each of said plural word lines, and the a second register having a capacity capable of storing one word data stored in said plural memory cells connected with each of said plural word lines, said data write/read method comprising:

a first write step of storing a first input serial data of one word in said first register;

a second write step of transferring the one word data stored in said first register in said first write step, to said plural memory cells connected with each of a plurality of first selected word lines selected from said plural word lines;

a third write step of storing a second input serial data of one word in said first register, said second input serial data being obtained by inverting the logical level of each bit of said first input serial data; and a fourth write step of transferring the one word data stored in said first register in said third write step, to said plural memory cells connected with each of a plurality of the second selected word lines selected from said plural word lines.

2. A method as claimed in claim 1 further comprising:

a first read step of selecting one first selected word line from said plural first selected word lines, and transferring the data stored in a plurality of memory cells connected with said one first selected word line to said second register;

a second read step of selecting one second selected word line from said plural second selected word lines, and transferring the data stored in a plurality of memory cells connected with said one second selected word line to said first register; and a third read step of serially reading out the data transferred to said second register in said first read step and serially reading out the data transferred to the first register in said second read step.

3. A data write/read method for a serial access memory, wherein the serial access memory includes a plurality of memory cells arranged at each of intersections made by a plurality of word lines and a plurality of bit lines, a first register having a capacity capable of storing one word data stored in said plural memory cells connected with each of in said plural memory cells connected with each of said plural word lines, and the a second register having a capacity capable of storing one word data stored in said plural memory cells connected with each of said plural word lines, said data write/read method comprising:

a first write step of storing a first input serial data of one word in said first register;

a second write step of transferring the one word data stored in said first register in said first write step, to said plural memory cells connected with each of a plurality of first selected word lines selected from said plural word lines; and a third write step of transferring said one word data stored in said first register, through a logic level inversion and transfer means for inverting the logical level on bit by bit basis, to a plurality of memory cells connected with each of said plural second selected word lines selected from said plural word lines.

4. A method as claimed in claim 3 further comprising:

a first read step of selecting one first selected word line from said plural first selected word lines, and transferring the data stored in a plurality of memory cells connected with said one first selected word line to said second register;

a second read step of selecting one second selected word line from said plural second selected word lines, and transferring the storage data of a plurality of memory cells connected with said one second selected word line to said first register; and a third read step of serially reading out the data transferred to said second register in said first read step and serially reading out the data transferred to the first register in said second read step.

5. A method as claimed in claim 4 further comprising:
a data comparison step of comparing the data serially read out from said first register with the data serially read out from said second register on a bit by bit basis.

6. A method as claimed in claim 5 further comprising:
a logical level inversion step of inverting the logical level of each bit which is serially read out from said first register before said data comparison step.

7. A data write/read method for a serial access memory, wherein the serial access memory includes a plurality of memory cells arranged at each of intersections made by a plurality of word lines and a plurality of bit lines, a first register having a capacity capable of storing one word data stored in said plural memory cells connected with each of in said plural memory cells connected with each of said plural word lines, and the a second register having a capacity capable of storing one word data stored in said plural memory cells connected with each of said plural word lines, said data write/read method comprising:

a first write step of storing a first input serial data of one word in said first register;

a second write step of transferring the one word data stored in said first register in said first write step, to said plural memory cells connected with each of a plurality of first selected word lines selected from said plural word lines; and a first read step of selecting two word lines from said plural first selected word lines, transferring the storage data of a plurality of memory cells connected with one of said selected two word lines to said second register, and transferring the storage data of a plurality of memory cells connected with the other word line of said selected two word lines to said first register; and a second read step of serially reading out the data transferred to said first register in said first read step and serially reading out the data transferred to said second register in said first read step.

8. A method as claimed in claim 7 further comprising:
a data comparison step of comparing the data serially read out from said first register with the data serially read out from said second register on the bit by bit basis.

9. A method as claimed in claim 8 further comprising:
a logical level inversion step of inverting the logical level of each bit of the data which is serially read out from said first register prior said data comparison step.

* * * * *